United States Patent
Makigawa et al.

(10) Patent No.: US 12,260,969 B2
(45) Date of Patent: Mar. 25, 2025

(54) CONDUCTIVE FILM, METHOD FOR PRODUCING SAME, CONDUCTOR, RESIST PATTERN FORMATION METHOD, AND LAMINATE

(71) Applicant: Mitsubishi Chemical Corporation, Tokyo (JP)

(72) Inventors: Saki Makigawa, Tokyo (JP); Akira Yamazaki, Tokyo (JP); Naoko Yamada, Tokyo (JP); Yoshiko Irie, Tokyo (JP); Shinji Saiki, Tokyo (JP); Masashi Uzawa, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 997 days.

(21) Appl. No.: 17/009,870

(22) Filed: Sep. 2, 2020

(65) Prior Publication Data
US 2021/0005343 A1    Jan. 7, 2021

Related U.S. Application Data

(63) Continuation of application No. PCT/JP2019/010536, filed on Mar. 14, 2019.

(30) Foreign Application Priority Data

Mar. 15, 2018    (JP) .................. 2018-048383

(51) Int. Cl.
*H01B 1/12* (2006.01)
*C08J 5/18* (2006.01)

(52) U.S. Cl.
CPC ............... *H01B 1/124* (2013.01); *C08J 5/18* (2013.01); *C08J 2300/12* (2013.01)

(58) Field of Classification Search
CPC ..................................................... H01B 1/124
See application file for complete search history.

(56) References Cited

U.S. PATENT DOCUMENTS

| | | |
|---|---|---|
| 5,560,870 A | 10/1996 | Watanabe et al. |
| 2012/0021341 A1 | 1/2012 | Watanabe et al. |
| | | (Continued) |

FOREIGN PATENT DOCUMENTS

| | | |
|---|---|---|
| CN | 102419510 A | 4/2012 |
| CN | 106661335 A | 5/2017 |
| | (Continued) | |

OTHER PUBLICATIONS

Combined Chinese Ofice Action and Search Report issued Jun. 9, 2021 in Chinese Patent Application No. 201980016372.4 (with unedited computer generated English translation), 17 pages.

(Continued)

*Primary Examiner* — Dah-Wei D. Yuan
*Assistant Examiner* — Andrew J Bowman
(74) *Attorney, Agent, or Firm* — Oblon, McClelland, Maier & Neustadt, L.L.P.

(57) ABSTRACT

The conductive film of the present invention includes a conductive polymer (A) and has a film thickness of 35 nm or less, wherein: a surface resistance of the conductive film is $1\times10^{11}$ Ω/sq. or less, and a standard deviation of current that flows through the conductive film upon application of voltage to the conductive film is 5 or less. The conductor of the present invention has a substrate, and the conductive film provided on at least a part of the surface of the substrate. The resist pattern forming method of the present invention includes a lamination step of forming the conductive film on a surface of a resist layer including a chemically amplified resist, said resist layer formed on one surface of a substrate, and an exposure step of irradiating the substrate with an (Continued)

electron beam according to a pattern on its side on which the conductive film is formed. The laminate of the present invention has a resist layer and an antistatic film formed on the surface of the resist layer, wherein the antistatic film is the above-mentioned conductive film.

15 Claims, 1 Drawing Sheet

(56) References Cited

U.S. PATENT DOCUMENTS

| | | |
|---|---|---|
| 2015/0132537 A1 | 5/2015 | Fukuda et al. |
| 2017/0261854 A1 | 9/2017 | Yamazaki et al. |

FOREIGN PATENT DOCUMENTS

| | | | | |
|---|---|---|---|---|
| EP | 2 410 379 A2 | | 1/2012 | |
| EP | 3 144 351 A1 | | 3/2017 | |
| JP | 2002-226721 A | | 8/2002 | |
| JP | 2016-080964 A | | 5/2016 | |
| JP | 2016080964 | * | 5/2016 | ............. G03F 7/038 |
| KR | 10-2014-0134310 | | 11/2014 | |
| KR | 10-201400134310 | * | 11/2014 | |
| WO | WO 2014/017540 A1 | | 1/2014 | |

OTHER PUBLICATIONS

Taiwanese Office Action issued Sep. 29, 2022 in Taiwanese Patent Application No. 108108501 (with English Translation), 19 pages.
Japanese Office Action issued Oct. 4, 2022 in Japanese Patent Application No. 2020-506645 (with unedited computer generated English Translation), 7 pages.
Extended European Search Report issued Apr. 12, 2021 in European Patent Application No. 19768595.1, 6 pages.
International Search Report issued May 28, 2019 in PCT/JP2019/010536 filed on Mar. 14, 2019, 2 pages (with English Translation).
Chinese Office Action issued Nov. 24, 2021 in Chinese Patent Application No. 201980016372.4 (with English machine translation), 17 pages.
Office Action issued May 23, 2023, in corresponding Japanese Patent Application No. 2020-506645 (with English Translation), 10 pages.
Korean Office Action issued Oct. 23, 2023 in Korean Patent Application No. 10-2020-7025206 (with unedited computer-generated English Translation), 10 pages.
Office Action mailed on Apr. 30, 2024, in corresponding Korean Patent Application No. 10-2020-7025206 (with machine translation).
Decision of Rejection mailed on Dec. 13, 2024, in corresponding KR Patent Application No. 10-2020-7025206 (with English machine translation).

* cited by examiner

CONDUCTIVE FILM, METHOD FOR PRODUCING SAME, CONDUCTOR, RESIST PATTERN FORMATION METHOD, AND LAMINATE

This application is a continuation application of International Application No. PCT/JP2019/010536, filed on Mar. 14, 2019, which claims priority to Japanese Patent Application No. 2018-048383, filed Mar. 15, 2018, the contents of which are incorporated herein by reference.

TECHNICAL FIELD

The present invention relates to a conductive film, a method for producing the same, a conductor, a method for forming a resist pattern, and a laminate.

BACKGROUND ART

Patterning techniques using charged particle beams such as electron beams and ion beams are promising candidates of the next generation technology of photolithography.

For improving the productivity with the use of charged particle beams, it is important to improve the sensitivity of the resist. From this perspective, the mainstream process uses a highly sensitive chemically amplified resist that is allowed to generate an acid in its area exposed to light or irradiated with the charged particle beam, which is followed by a heat treatment called "post exposure bake (PEB)" to accelerate crosslinking reaction or decomposition reaction.

Incidentally, especially when the substrate is insulating, the patterning method using the charged particle beams has a problem that the trajectory of the charged particle beam is bent due to an electric field generated by the charge (charge up) of the substrate, resulting in difficulty in obtaining a desired pattern.

As a means to solve this problem, there is a technique already known to be effective, which applies a conductive composition containing a conductive polymer to a surface of a resist layer to form a conductive film (antistatic film) so as to coat the surface of the resist layer with the conductive film.

For example, Patent Document 1 proposes a conductive composition including a conductive polymer having an acidic group, a water-soluble polymer having a nitrogen-containing functional group and a hydrophobic terminal group, and a solvent.

PRIOR ART REFERENCES

Patent Document

Patent Document 1: Japanese Patent Application Unexamined Publication No. 2002-226721

DISCLOSURE OF INVENTION

Problems to be Solved by the Invention

However, in the case of the conductive film formed from the conductive composition described in Patent Document 1, the conductivity is not always uniform. When the conductivity of the conductive film is not uniform, the irradiation of the electron beam may become uneven, resulting in a pattern defect after electron beam lithography.

The object of the present invention is to provide a conductive film having uniform conductivity, a method for producing the same, a conductor, a method for forming a resist pattern, and a laminate.

Means to Solve the Problems

The embodiments of the present invention are as follows.

[1] A conductive film including a conductive polymer (A) and having a film thickness of 35 nm or less, wherein: a surface resistivity of the conductive film is $1 \times 10^{11}$ Ω/sq. or less, and a standard deviation of current that flows through the conductive film upon application of voltage to the conductive film is 5 or less.

[2] The conductive film according to [1], which further includes a basic compound (B).

[3] The conductive film according to [1] or [2], which further includes a surfactant.

[4] The conductive film according to any one of [1] to [3], wherein the conductive polymer (A) has an acidic group.

[5] The conductive film according to [4], wherein the conductive polymer (A) has a monomer unit represented by formula (1):

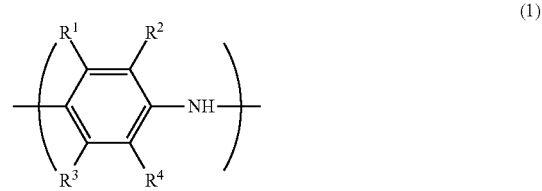

wherein each of $R^1$ to $R^4$ independently represents a hydrogen atom, a linear or branched alkyl group having 1 to 24 carbon atoms, a linear or branched alkoxy group having 1 to 24 carbon atoms, an acidic group, a hydroxy group, a nitro group or a halogen atom, with the proviso that at least one of $R^1$ to $R^4$ is an acidic group or a salt thereof, and the acidic group is a sulfonic acid group or a carboxy group.

[6] The conductive film according to any one of [1] to [5], which is for antistatic use in charged particle beam lithography.

[7] A method for producing the conductive film of any one of [1] to [6], which includes shaping a conductive composition including the conductive polymer (A) into the conductive film.

[8] The method according to [7], wherein an amount of a polymerization residue derived from the conductive polymer (A) in the conductive composition is 0.8% by mass or less, based on a total mass of the conductive polymer (A).

[9] The method according to [7] or [8], wherein an amount of a high boiling point solvent in the conductive composition is 150 ppm by mass or less, based on a total mass of the conductive composition, and the high boiling point solvent has a boiling point of 180° C. or higher.

[10] The method according to any one of [7] to [9], which has a water content of 50% by mass or more, based on a total mass of the conductive composition.

[11] A conductor including a substrate, and the conductive film of any one of [1] to [6] which is formed on at least a part of surface of the substrate.

[12] A method for forming a resist pattern, including a lamination step of forming the conductive film of any one of [1] to [6] on a surface of a resist layer including a chemically amplified resist, said resist layer formed on one surface of a substrate, and an exposure step of irradiating the substrate with an electron beam according to a pattern on its side on which the conductive film is formed.

[13] A laminate including a resist layer and an antistatic film formed on a surface of the resist layer, wherein: the antistatic film includes a conductive polymer (A), the antistatic film has a thickness of 35 nm or less, the antistatic film has a surface resistivity of $1\times10^{11}$ Ω/sq. or less, and a standard deviation of current that flows through the antistatic film upon application of voltage to the antistatic film is 5 or less.

Effects of Invention

The present invention can provide a conductive film having uniform conductivity, a method for producing the same, a conductor, a method for forming a resist pattern, and a laminate.

DESCRIPTION OF EMBODIMENTS

Figure 1:
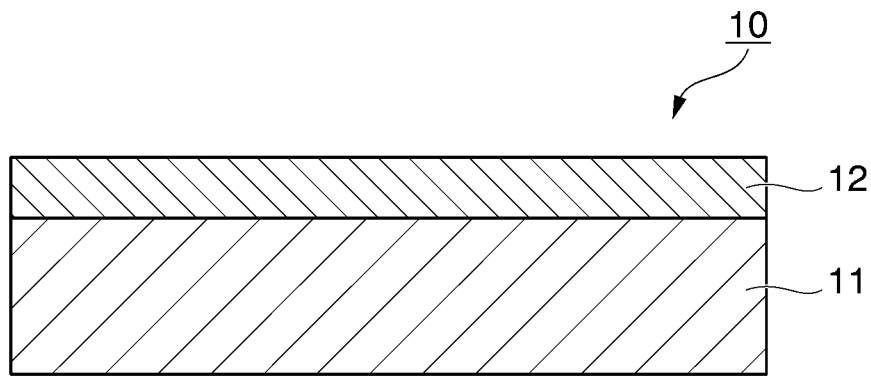
FIG. 1 is a cross-sectional view showing an example of the conductor of the present invention.

Hereinbelow, the present invention will be described in detail.

In the present invention, the term "conductive" means that a surface resistivity is $1\times10^{11}$ Ω/sq. or less. The surface resistivity is obtained from the potential difference between the currents when a constant current is flown.

In the present invention, the "terminal" of the "terminal hydrophobic group" means a site other than repeating units constituting a polymer.

Further, in the context of the present specification, the term "solubility" means that 0.1 g or more of a substance dissolves uniformly in 10 g (liquid temperature 25° C.) of water, water containing at least one of a base and a basic salt, water containing an acid, or a solvent mixture of water and a water-soluble organic solvent. Furthermore, the term "water-soluble" means the solubility in water in relation to the aforementioned solubility.

Further, in the context of the present specification, the term "weight average molecular weight" refers to a weight average molecular weight (in terms of sodium polystyrene sulfonate or polyethylene glycol) as measured by gel permeation chromatography (GPC).

[Conductive Film]

The conductive film of the first embodiment of the present invention includes a conductive polymer (A) and has a film thickness of 35 nm or less. It is preferable that the conductive film further includes a basic compound (B). The conductive film may, if necessary, further contain a surfactant such as a water-soluble polymer (C) having a nitrogen-containing functional group and a terminal hydrophobic group in its molecule, or an optional component.

As a result of intensive studies, the present inventors have found that the low molecular weight materials contained in a conductive film is a factor that hinders the conductivity, resulting in non-uniform conductivity.

In this context, examples of the "low molecular weight materials" include those derived from the conductive polymer (A) and the water-soluble polymer (C). More specific examples of the low molecular weight materials derived from the conductive polymer (A) include raw material monomers (residual monomers) of the conductive polymer (A) and sulfate ions. A sulfate ion is a free acidic group eliminated from the conductive polymer (A), a decomposition product from an oxidant used for polymerization of the raw material monomers, or the like. Examples of the low molecular weight material derived from the water-soluble polymer (C) include those having a weight average molecular weight of 600 or less, and more specific examples include raw material monomers (residual monomers) and oligomers of the water-soluble polymer (C), as well as various additives used in polymerization of the raw material monomers. However, when the conductive film contains the basic compound (B), the basic compound (B) shall not be encompassed by the low molecular weight materials.

In the context of the present specification, the low molecular weight materials derived from the conductive polymer (A) are also referred to as "polymerization residue derived from the conductive polymer (A)", and the low molecular weight materials derived from the water-soluble polymer (C) are also referred to as "polymerization residue derived from water-soluble polymer (C)".

The thickness of the conductive film is 35 nm or less, preferably 30 nm or less, and even more preferably 20 nm or less. When the thickness of the conductive film is 35 nm or less, the percentage of low molecular weight materials present in the film decreases relatively, so that the conductivity tends to be more uniform. The film thickness of the conductive film is preferably 5 nm or more. When the film thickness is 5 nm or more, the smoothness of the conductive film can be well maintained.

The film thickness of the conductive film is a value measured using a stylus profilometer.

The surface resistivity of the conductive film is $1\times10^{11}$ Ω/sq. or less and is preferably $5\times10^{10}$ Ω/sq. or less. The lower the surface resistivity of the conductive film, the higher the conductivity thereof, resulting in the conductive film showing sufficient conductivity. The lower limit of the surface resistivity of the conductive film is not particularly limited, but is generally $1\times10^{0}$ Ω/sq.

The surface resistivity of the conductive film is a value measured by a surface resistivity meter.

The standard deviation of the current value that flows through the conductive film upon application of a voltage to the conductive film is 5 or less, preferably 2.5 or less, more preferably 2 or less, even more preferably 1.5 or less, and particularly preferably 1 or less. When the standard deviation of the current value is 5 or less, the conductivity becomes uniform. The standard deviation of the current value is preferably as small as possible, that is, the standard deviation is preferably as closer to 0 as possible, and is most preferably 0.

The standard deviation of the current value is a value measured using a scanning probe microscope (SPM) such as a conductive atomic force microscope (C-AFM). Specifically, using a conductive prove, a constant voltage is applied between the probe and the conductive film, and the current value from the probe is measured by scanning the measurement area of 0.5×1 μm (measurement points: 64×128 points) while measuring and imaging the current value from the probe, to thereby determine an average value and a standard deviation of the current value.

Among the low molecular weight materials in the conductive film, the amount of the low molecular weight materials derived from the conductive polymer (A) is preferably 5% by mass or less, and more preferably 1% by mass or less, based on a total weight of the conductive polymer (A) in the conductive film. When the amount of the low molecular weight materials is 5% by mass or less, the conductivity becomes more uniform. The amount of the low molecular weight materials is preferred to be as small as possible.

The amount of the low molecular weight materials derived from the conductive polymer (A) is measured by means of an ion chromatography (IC). Specifically, with respect to a test solution ($\alpha$) in which the conductive film is dissolved in water with the solids concentration being adjusted to 2% by mass, the concentrations of the residual monomers and the sulfate ions in the conductive polymer (A) were measured using IC to obtain a chromatogram. The areas or heights of the peaks corresponding to the residual monomers and the sulfate ions on this chromatogram are read, and the amounts of the low molecular weight materials in the conductive polymer (A) are determined from a calibration curve prepared in advance.

Among the low molecular weight materials in the conductive film, the amount of the low molecular weight materials derived from the water-soluble polymer (C) is preferably such that a peak area ratio is 0.44 or less, which is determined based on results of analysis performed using a high performance liquid chromatograph mass spectrometer with respect to a test solution ($\beta$) obtained by extracting the water-soluble polymer (C) from an aqueous solution obtained by dissolving the conductive film in water with an organic solvent ($\beta$), and calculated by formula (I): When the peak area ratio calculated by the following formula (I) is 0.44 or less, the conductivity becomes more uniform. The peak area ratio calculated by the following formula (I) is preferred to be as small as possible.

$$\text{Area ratio} = Y/(X+Y) \tag{I}$$

wherein X is a total peak area of an extracted ion chromatogram prepared with respect to ions derived from compounds having a molecular weight (M) of 600 or more from a total ion current chromatogram, Y is a total peak area of an extracted ion chromatogram prepared with respect to ions derived from compounds having a molecular weight (M) of less than 600 from the total ion current chromatogram.

The organic solvent ($\beta$) is not particularly limited as long as it is a solvent that does not dissolve the conductive polymer (A) contained in the conductive film and can dissolve the water-soluble polymer (C), but is preferably an organic solvent having an SP value of 6 to 15, and more preferably 7 to 13. Specific examples thereof include n-butanol, butyl acetate, and methyl isobutyl ketone.

The arithmetic average roughness (Ra) of the conductive film is preferably 0.7 nm or less, and more preferably 0.6 nm or less. When the arithmetic average roughness (Ra) of the conductive film is 0.7 nm or less, the conductivity becomes more uniform. Further, the arithmetic average roughness (Ra) of the conductive film is preferably 0.1 nm or more from the perspective of reliability of measured values.

The arithmetic average roughness (Ra) of the conductive film is a value measured by using a stylus profilometer (measuring device for level gap, surface roughness, and fine shape).

<Conductive Polymer (A)>

Examples of the conductive polymer (A) include polypyrrole, polythiophene, polythiophene vinylene, polytellurophene, polyphenylene, polyphenylene vinylene, polyaniline, polyacene, polyacetylene and the like.

Among these, polypyrrole, polythiophene and polyaniline are preferable from the perspective of excellent conductivity.

Specific examples of monomers (raw material monomers) constituting polypyrrole include pyrrole, N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole and the like.

Specific examples of monomers (raw material monomers) constituting polythiophene include thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyoxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butylenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, 6-(2,3-dihydrothieno[3,4-b][1,4]dioxin-2-yl)hexane-1-sulfonic acid, 6-(2,3-dihydro-thieno[3,4-b][1,4]dioxin-2-yl)hexane-1-sulfonic acid sodium salt, 6-(2,3-dihydro-thieno[3,4-b][1,4]dioxin-2-yl)hexane-1-sulfonic acid lithium salt, 6-(2,3-dihydro-thieno[3,4-b][1,4]dioxin-2-yl)hexane-1-sulfonic acid potassium salt, 8-(2,3-dihydro-thieno[3,4-b][1,4]dioxin-2-yl)octane-1-sulfonic acid, 8-(2,3-dihydro-thieno[3,4-b][1,4]dioxin-2-yl)octane-1-sulfonic acid sodium salt, 8-(2,3-dihydro-thieno[3,4-b][1,4]dioxin-2-yl) octane-1-sulfonic acid potassium salt, 3-[(2,3-dihydrothieno[3,4-b]-[1,4]dioxin-2-yl)methoxy]-1-propanesulfonic acid sodium salt, 3-[(2,3-dihydrothieno[3,4-b]-[1,4]dioxin-2-yl)methoxy]-1-propanesulfonic acid potassium salt, 3-[(2,3-dihydrothieno[3,4-b]-[1,4]dioxin-2-yl)methoxy]-1-methyl-1-propanesulfonic acid sodium salt, 3-[(2,3-dihydrothieno[3,4-b]-[1,4]dioxin-2-yl)methoxy]-1-ethyl-1-propanesulfonic acid sodium salt, 3-[(2,3-dihydrothieno[3,4-b]-[1,4]dioxin-2-yl)methoxy]-1-propyl-1-propanesulfonic acid sodium salt, 3-[(2,3-dihydrothieno[3,4-b]-[1,4]dioxin-2-yl)methoxy]-1-butyl-1-propanesulfonic acid sodium salt, 3-[(2,3-dihydrothieno[3,4-b]-[1,4]dioxin-2-yl)methoxy]-1-pentyl-1-propanesulfonic acid sodium salt, 3-[(2,3-dihydrothieno[3,4-b]-[1,4]dioxin-2-yl)methoxy]-1-hexyl-1-propanesulfonic acid sodium salt, 3-[(2,3-dihydrothieno[3,4-b]-[1,4]dioxin-2-yl)methoxy]-1-isopropyl-1-propanesulfonic acid sodium salt, 3-[(2,3-dihydrothieno[3,4-b]-[1,4]dioxin-2-yl)methoxy]-1-isobutyl-1-propanesulfonic acid sodium salt, 3-[(2,3-dihydrothieno[3,4-b]-[1,4]dioxin-2-yl)methoxy]-1-isopentyl-1-propanesulfonic acid sodium salt, 3-[(2,3-dihydrothieno[3,4-b]-[1,4]dioxin-2-yl)methoxy]-1-fluoro-1-propanesulfonic acid sodium salt, 3-[(2,3-dihydrothieno[3,4-b]-[1,4]dioxin-2-yl)methoxy]-1-methyl-1-propane sulfonate potassium salt, 3-[(2,3-dihydrothieno[3,4-b]-[1,4]dioxy-2-yl) methoxy]-1-methyl-1-propanesulfonic acid salt, 3-[(2,3-dihydrothieno[3,4-b]-[1,4] dioxin-2-yl) methoxy]-1-methyl-1-propanesulfonic acid ammonium salt, 3-[(2,3-dihydrothieno[3,4-b]-[1,4]dioxin-2-yl)methoxy]-2-methyl-1-propanesulfonic acid sodium salt, 3-[(2,3-dihydrothieno[3,4-b]-[1,4]dioxin-2-yl)methoxy]-1-methyl-1-propanesulfonic acid triethylammonium salt, 4-[(2,3-dihydrothieno[3,4-b]-[1,4]dioxin-2-yl)methoxy]-1-butanesulfonic acid sodium salt, 4-[(2,3-dihydrothieno[3,4-b]-[1,4]dioxin-2-yl)methoxy]-1-butanesulfonic acid potassium salt, 4-[(2,3-dihydrothieno[3,4-b]-[1,4]dioxin-2-yl)methoxy]-1-methyl-1-butanesulfonic acid sodium salt, 4-[(2,3-dihydrothieno[3,4-b]-[1,4]dioxin-2-yl)methoxy]-1-methyl-1-butanesulfonic acid potassium salt, 4-[(2,3-dihydrothieno[3,4-b]-[1,4]dioxin-2-yl)methoxy]-1-fluoro-1-butanesulfonic acid sodium salt, and 4-[(2,3-dihydrothieno[3,4-b]-[1,4]dioxin-2-yl)methoxy]-1-fluoro-1-butanesulfonic acid potassium salt, and the like.

Other examples of the monomers constituting polythiophene include the monomers described in Japanese Unexamined Patent Application Publication Nos. 2016-188350, 2017-52886, 2014-65898 and 2017-101102.

Specific examples of monomers (raw material monomers) constituting polyaniline include aniline, 2-methylaniline, 3-isobutylaniline, 2-methoxyaniline, 2-ethoxyaniline, 2-anilinesulfonic acid, 3-anilinesulfonic acid and the like.

The conductive polymer (A) preferably has water solubility or water dispersibility. When the conductive polymer (A) has water solubility or water dispersibility, the coatability of the conductive composition is enhanced, and a conductor having a uniform thickness can be easily obtained.

The conductive polymer (A) preferably has an acidic group. When the conductive polymer (A) has an acidic group, the water solubility can be enhanced.

The conductive polymer having an acidic group is not particularly limited as long as the polymer has at least one group selected from the group consisting of a sulfonic acid group and a carboxy group in its molecule and the effects of the present invention can be obtained, and examples thereof preferable from the perspective of solubility include conductive polymers described in Japanese Patent Unexamined Publication Nos. Sho 61-197633, Sho 63-39916, Hei 1-301714, Hei 5-504153, Hei 5-503953, Hei 4-32848, Hei 4-328181, Hei 6-145386, Hei 6-56987, Hei 5-226238, Hei 5-178989, Hei 6-293828, Hei 7-118524, Hei 6-32845, Hei 6-87949, Hei 6-256516, Hei 7-41756, Hei 7-48436, Hei 4-268331, and 2014-65898.

Specific examples of the conductive polymer having an acidic group include π-conjugated conductive polymers containing, as repeating units, at least one type of monomers selected from the group consisting of phenylene vinylene, vinylene, thienylene, pyrrolylene, phenylene, iminophenylene, isothianaphthene, furylene, and carbazolylene, each having its α position or β position substituted with at least one group selected from the group consisting of a sulfonic acid group and a carboxy group.

When the π-conjugated conductive polymer contains at least one repeating unit selected from the group consisting of iminophenylene and carbazolylene, examples thereof include a conductive polymer having at least one group selected from the group consisting of a sulfonic acid group and a carboxy group on the nitrogen atoms of the repeating units, and a conductive polymer having an alkyl group (or an ether bond-containing alkyl group) substituted with at least one group selected from the group consisting of a sulfonic acid group and a carboxy group on the nitrogen atoms of the repeating units.

Among these, from the perspective of conductivity and solubility, it is preferable to use conductive polymers having at least one type of monomer unit selected from the group consisting of thienylene, pyrrolylene, iminophenylene, phenylenevinylene, carbazolylene, and isothianaphthene, each having its β position substituted with at least one group selected from the group consisting of a sulfonic acid group and a carboxy group.

The conductive polymer (A) preferably has at least one type of monomer unit selected from the group consisting of monomer units represented by the following formulae (2) to (5) from the perspective of conductivity and solubility.

(2)

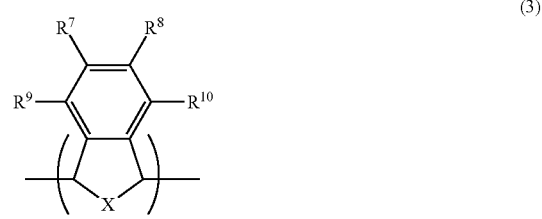

(3)

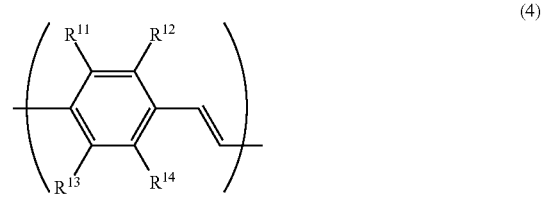

(4)

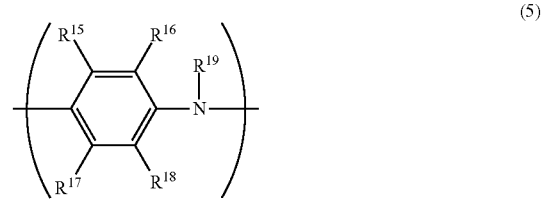

(5)

In the formulae (2) to (5), X represents a sulfur atom or a nitrogen atom, and each of $R^5$ to $R^{19}$ independently represents a hydrogen atom, a linear or branched alkyl group having 1 to 24 carbon atoms, a linear or branched alkoxy group having 1 to 24 carbon atoms, an acidic group, a hydroxy group, a nitro group, a halogen atom (—F, —Cl —Br or —I), —N($R^{20}$)$_2$, —NHCOR$^{20}$, —SR$^{20}$, —OCOR$^{20}$, —COOR$^{20}$, —COR$^{20}$, —CHO or —CN. $R^{20}$ is preferably an alkyl group having 1 to 24 carbon atoms, an aryl group having 6 to 24 carbon atoms, or an aralkyl group having 7 to 24 carbon atoms.

However, at least one of $R^5$ to $R^6$ in the formula (2), at least one of $R^7$ to $R^{10}$ in the formula (3), at least one of $R^{11}$ to $R^{14}$ in the formula (4), and at least one of $R^{15}$ to $R^{19}$ in the formula (5) are each an acidic group or a salt thereof.

In this context, the "acidic group" means a sulfonic acid group (sulfo group) or a carboxylic acid group (carboxy group).

The sulfonic acid group may be present in an acid form (—SO$_3$H) or an ionic form (—SO$_3^-$). Further, the sulfonic acid group also encompasses a substituent having a sulfonic acid group (—R$^{21}$SO$_3$H).

On the other hand, the carboxylic acid group may be present in an acid form (—COOH) or an ionic form (—COO$^-$). Further, the carboxylic acid group also encompasses a substituent having a carboxylic acid group (—R$^{21}$COOH).

R$^{21}$ represents a linear or branched alkylene group having 1 to 24 carbon atoms, a linear or branched arylene group having 6 to 24 carbon atoms, or a linear or branched aralkylene group having 7 to 24 carbon atoms.

Examples of the salt of acidic group include alkali metal salts, alkaline earth metal salts, ammonium salts, and substituted ammonium salts of a sulfonic acid group or a carboxylic acid group.

Examples of the alkali metal salt include lithium sulfate, lithium carbonate, lithium hydroxide, sodium sulfate, sodium carbonate, sodium hydroxide, potassium sulfate, potassium carbonate, potassium hydroxide and derivatives having skeletons thereof.

Examples of the alkaline earth metal salt include magnesium salts, calcium salts and the like.

Examples of the substituted ammonium salt include aliphatic ammonium salts, saturated alicyclic ammonium salts, unsaturated alicyclic ammonium salts and the like.

Examples of the aliphatic ammonium salts include methyl ammonium, dimethyl ammonium, trimethyl ammonium, ethyl ammonium, diethyl ammonium, triethyl ammonium, methyl ethyl ammonium, diethyl methyl ammonium, dimethyl ethyl ammonium, propyl ammonium, dipropyl ammonium, isopropyl ammonium, diisopropyl ammonium, butyl ammonium, dibutyl ammonium, methyl propyl ammonium, ethyl propyl ammonium, methyl isopropyl ammonium, ethyl isopropyl ammonium, methyl butyl ammonium, ethyl butyl ammonium, tetramethyl ammonium, tetramethylol ammonium, tetra ethyl ammonium, tetra n-butyl ammonium, tetra sec-butyl ammonium, tetra t-butyl ammonium, and the like.

Examples of the saturated alicyclic ammonium salts include piperidinium, pyrrolidinium, morpholinium, piperazinium, and derivatives having skeletons thereof.

Examples of the unsaturated alicyclic ammonium salts include pyridinium, α-picolinium, β-picolinium, γ-picolinium, quinolinium, isoquinolinium, pyrrolinium, and derivatives having skeletons thereof.

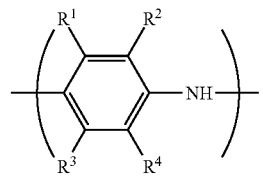

(1)

In the formula (1), each of R$^1$ to R$^4$ independently represents a hydrogen atom, a linear or branched alkyl group having 1 to 24 carbon atoms, a linear or branched alkoxy group having 1 to 24 carbon atoms, an acidic group, a hydroxy group, a nitro group or a halogen atom (—F, —Cl —Br or —I), with the proviso that at least one of R$^1$ to R$^4$ is an acidic group or a salt thereof. In this context, the acidic group is a sulfonic acid group or a carboxy group.

As for the monomer unit represented by the above formula (1), it is preferable in terms of easy production that any one of R$^1$ to R$^4$ is a linear or branched alkoxy group having 1 to 4 carbon atoms, while another one of R$^1$ to R$^4$ is a sulfonic acid group, and the remainder is hydrogen.

In the conductive polymer (A), for achieving very good solubility, the number of acid group-bonded aromatic rings is preferably 50% or more, more preferably 70% or more, even more preferably 90% or more, and most preferably 100%, relative to the total number of aromatic rings present in the polymer.

The number of acid group-bonded aromatic rings relative to the total number of aromatic rings present in the polymer refers to a value calculated from the compounding ratio of monomers at the production of the conductive polymer (A).

Further, with respect to substituents on the aromatic rings of the monomer units in the conductive polymer (A), the substituents other than the acidic group are preferably electron donating groups for imparting reactivity to the monomers. Specifically, the substituents are preferably alkyl groups having 1 to 24 carbon atoms, alkoxy groups having 1 to 24 carbon atoms, halogen groups (—F, —Cl, —Br or —I) and the like, and alkoxy groups having 1 to 24 carbon atoms are most preferable from the perspective of electron donation.

The conductive polymer (A) is preferably a compound having a structure represented by the following formula (6) since high conductivity and solubility can be achieved. Among the compounds having a structure represented by the formula (6), poly(2-sulfo-5-methoxy-1,4-iminophenylene) is particularly preferable.

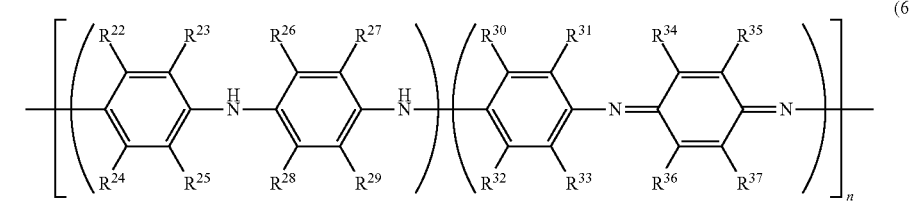

(6)

The conductive polymer (A) preferably has a monomer unit represented by the above formula (5) since high conductivity can be achieved. Among the monomer units represented by the above formula (5), from the perspective of excellent solubility, especially preferred is a monomer unit represented by the following formula (1).

In the formula (6), each of R$^{22}$ to R$^{37}$ independently represents a hydrogen atom, a linear or branched alkyl group having 1 to 4 carbon atoms, a linear or branched alkoxy group having 1 to 4 carbon atoms, an acidic group, a hydroxy group, a nitro group or a halogen atom (—F, —Cl —Br or —I), with the proviso that at least one of R$^{22}$ to R$^{37}$ is an acidic group or a salt thereof. Further, n represents a polymerization degree. In the present invention, n is preferably an integer of 5 to 2500.

It is desirable that at least a part of the acidic groups possessed by the conductive polymer (A) is in a free acid form from the perspective of conductivity improvement.

Other than those described above as the conductive polymer (A), for example, it is possible to use, as the conductive polymer having a sulfonic acid group, a conductive polymer having at least one type of monomer unit selected from the group consisting of monomer units represented by the following formulae (7) and (8).

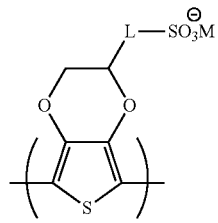

(7)

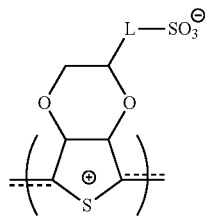

(8)

In the formulae (7) and (8), L is represented by $-(CH_2)_p-$ or the following formula (9), M represents a hydrogen ion, an alkali metal ion, an alkaline earth metal ion, a conjugate acid of an amine compound, or a quaternary ammonium cation. In these formulae, p is an integer of 6 to 12.

The term "conjugate acid of an amine compound" indicates an amine compound turned into a cationic species by addition of a hydrone ($H^+$). Specific examples include an amine compound represented by $N(R^{38})_3$ having sp3 hybrid orbitals (the conjugate acid being represented by $[NH(R^{38})_3]^+$), and a pyridine compound or an imidazole compound having sp2 hybrid orbitals. $R^{38}$ is a hydrogen atom or an alkyl group having 1 to 6 carbon atoms.

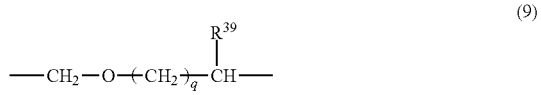

(9)

In the formula (9), $R^{39}$ represents a hydrogen atom, a linear or branched alkyl group having 1 to 6 carbon atoms, or a halogen atom (—F, —Cl —Br or —I). In this formula, q represents an integer of 1 to 6.

The monomer unit represented by the formula (8) shows a doped state of the monomer unit represented by the formula (7).

Dopants that cause an insulator-metal transition by doping include an acceptor and a donor. An acceptor approaches a polymer chain of the conductive polymer (A) and takes π electrons away from the conjugated system of the main chain by doping. As a result, positive charges (holes) are injected onto the main chain; therefore, the acceptor is also referred to as a p-type dopant. On the other hand, the donor is also referred to as a n-type dopant because it supplies electrons to the conjugated system of the main chain, and these electrons move in the conjugated system of the main chain.

From the perspective of conductivity, solubility and film formability, the weight average molecular weight of the conductive polymer (A) is preferably 1,000 to 1,000,000, more preferably 1,500 to 800,000, still more preferably 2,000 to 500,000, and particularly preferably 2,000 to 100,000, in terms of sodium polystyrene sulfonate as determined by GPC. When the weight average molecular weight of the conductive polymer (A) is less than 1000, good solubility may be achieved, but the conductivity and the film formability may be insufficient. On the other hand, when the weight average molecular weight of the conductive polymer (A) exceeds 1,000,000, good conductivity may be achieved, but the solubility may be insufficient.

The term "film formability" refers to an ability to form a uniform film without cissing etc., which can be evaluated by a method such as spin coating on glass.

As for the method for producing the conductive polymer (A), there is no particular limitation and any known method can be employed as long as the desired effects of the present invention are available.

Specific examples of the method include a method of polymerizing polymerizable monomers (raw material monomers) capable of forming any of the above monomer units by various synthesis methods such as a chemical oxidation method, an electrolytic oxidation method and the like. As such method, for example, the synthesis methods described in Japanese Unexamined Patent Application Publication Nos. Hei 7-196791 and Hei 7-324132 can be adopted.

An example of method for producing the conductive polymer (A) is described below.

For example, the conductive polymer (A) can be obtained by polymerizing raw material monomers using an oxidant in the presence of a basic reaction auxiliary.

Examples of the basic reaction auxiliary include inorganic bases (e.g., sodium hydroxide, potassium hydroxide, lithium hydroxide, etc.), ammonia, aliphatic amines, cyclic saturated amines, and cyclic unsaturated amines.

Examples of the oxidant include peroxodisulfuric acids (e.g., peroxodisulfuric acid, ammonium peroxodisulfate, sodium peroxodisulfate, potassium peroxodisulfate, etc.), hydrogen peroxide, etc.

Examples of the polymerization method include a method of dropping a mixture of raw material monomers and a basic reaction auxiliary into an oxidant solution, a method of dropping an oxidant solution into a mixture of raw material monomers and a basic reaction auxiliary, and a method of dropping a mixture of raw material monomers and a basic reaction auxiliary as well as an oxidant solution into a reaction vessel simultaneously.

After the polymerization, the solvent is usually separated by a separation device such as a centrifugal separator. The conductive polymer (A) is obtained by drying the filtered material after washing it with a washing solution if necessary.

The thus obtained conductive polymer (A) may contain low molecular weight materials (polymerization residue) such as raw material monomers (residual monomers) or sulfate ions. These low molecular weight materials (polymerization residue) cause the deterioration of conductivity.

Therefore, it is preferable to purify the conductive polymer (A) to remove the low molecular weight materials (polymerization residue). In other words, the conductive film preferable contains a purified conductive polymer (A).

The amount of the polymerization residue in the conductive polymer (A) is preferably 0.8% by mass or less, and more preferably 0.6% by mass or less, based on the total mass of the conductive polymer (A). When the amount of the polymerization residue is 0.8% by mass or less, the uniformity of conductivity further increases. The amount of the polymerization residue is preferred to be as small as possible.

The amount of the polymerization residue derived from the conductive polymer (A) is measured by means of ion chromatography (IC). Specifically, a test solution is prepared by adding an eluent to an aqueous solution of the conductive polymer (A) with its solids concentration being adjusted to 2% by mass. The concentration of the polymerization residue of the conductive polymer (A) is measured by means of IC to obtain a chromatogram. The area or height of the peak corresponding to the polymerization residue on this chromatogram is read, and the amount of the polymerization residue in the conductive polymer (A) is determined from a calibration curve prepared in advance. As the eluent, a mixed solution (mass ratio 1:1) of an aqueous sodium carbonate solution having a solids concentration of 1.8 mmol/l and an aqueous sodium hydrogen carbonate solution having a solids concentration of 1.7 mmol/l is used.

Whether or not the conductive polymer (A) contained in the conductive film is purified is determined by, for example, measuring the amount of the low molecular weight materials derived from the conductive polymer (A) in the conductive film with an ion chromatography mass spectrometer or the like, following the method described above. Specifically, when the amount of the low molecular weight materials derived from the conductive polymer (A) is 5% by mass or less, based on the total mass of the conductive polymer (A) in the conductive film, the conductive polymer (A) can be confirmed to be a purified one.

The polymerization residue in the conductive polymer (A) mainly include residual monomers and decomposition products (sulfate ions) of the oxidant used for the polymerization. On the other hand, the low molecular weight materials derived from the conductive polymer (A) in the conductive film mainly include residual monomers, decomposition products (sulfate ions) of the oxidant used for the polymerization, and free acidic groups (sulfate ions) eliminated from the conductive polymer (A).

The method for purifying the conductive polymer (A) is not particularly limited, any purification methods can be employed, such as ion exchange method, acid cleaning in a protonic acid solution, removal by heat treatment, and neutralization and precipitation; however, the ion exchange method is particularly effective because a highly-purified conductive polymer (A) can obtained with ease.

Examples of the ion exchange method include a column- or batch-treatment using ion exchange resins such as cation exchange resins or anion exchange resins; electrodialysis methods, etc.

When the conductive polymer (A) is purified by the ion exchange method, it is preferable to dissolve a reaction mixture obtained by the polymerization in an aqueous medium to a desired solids concentration, and then allow the resulting polymer solution to contact a cation exchange resin.

The aqueous media may be water, an organic solvent, or a solvent mixture of water and an organic solvent. The organic solvent may be the same as the solvent (D) described below.

The concentration of the conductive polymer (A) in the polymer solution is preferably 0.1 to 20% by mass, and more preferably 0.1 to 10% by mass from the viewpoint of industrial efficiency and purification efficiency.

The amount of the cation exchange resin is preferably 100 to 2000 parts by mass, and more preferably 500 to 1500 parts by mass, relative to 100 parts by mass of the conductive polymer (A). When the amount of the cation exchange resin is 100 parts by mass or more, the low molecular weight materials are sufficiently removed. On the other hand, when the amount of the cation exchange resin exceeds 2000 parts by mass, the amount becomes excessive with respect to the polymer solution, making it difficult to recover the polymer solution after the cation exchange treatment by contact with the cation exchange resin.

Examples of the cation exchange resin include "Amberlite IR-120B" manufactured by Organo Corporation. Examples of the anion exchange resin include "Amberlite IRA410" manufactured by Organo Corporation.

One example of a method of contacting the polymer solution with the cation exchange resin is a method of adding the polymer solution and the cation exchange resin into a container, followed by stirring or rotating to bring the polymer solution into contact with the cation exchange resin.

Another example is a method in which the cation exchange resin is packed in a column and the polymer solution is passed through the column at a flow rate of preferably SV=0.01 to 20, and more preferably SV=0.2 to 10 to carry out a cation exchange treatment.

In this context, space velocity SV (1/hr)=flow rate (m$^3$/hr)/amount of filter material (volume: m$^3$).

From the perspective of purification efficiency, the time for contacting the polymer solution with the cation exchange resin is preferably 0.1 hour or longer, and more preferably 0.5 hour or longer.

The upper limit of the contact time is not particularly limited and may be appropriately set depending on conditions such as the concentration of the polymer solution, the amount of the cation exchange resin, and the contact temperature described later.

The temperature at which the polymer solution and the cation exchange resin are brought into contact with each other is preferably 10 to 50° C., and more preferably 10 to 30° C. from the perspective of commercial practice.

In the case of the electrodialysis method, an ion exchange membrane to be used in the electrodialysis method is not particularly limited, but is preferably an ion exchange membrane which has been rendered monovalent ion-selective and is with a molecular weight cut-off of 300 or less in order to further suppress the permeation of impurities by diffusion. As such an ion exchange membrane, for example, "Neoceptor CMK (cation exchange membrane, molecular weight cut-off: 300)" and "Neoceptor AMX (anion exchange membrane, molecular weight cut-off: 300)", each manufactured by Astom Co., Ltd., are suitable. Further, as the ion exchange membrane used in the electrodialysis method, a bipolar membrane which is an ion exchange membrane having a structure in which an anion exchange layer and a cation exchange layer are bonded together may be used as well. As such a bipolar membrane, for example, "PB-1E/CMB" manufactured by Astom Co., Ltd. is suitable. The current density in the electrodialysis is preferably not more than the limiting current density. The voltage to be applied in the case of a bipolar membrane is preferably 10 to 50 V, and more preferably 25 to 35 V.

<Basic Compound (B)>

When the conductive polymer (A) has an acidic group, it is considered that the use of the basic compound (B) efficiently acts on the acidic group in the conductive polymer (A) to form a salt, so that the stability of the conductive polymer (A) can be improved. As a result, a mesh structure can be easily formed to facilitate uniform current flow through the conductive film, resulting in more uniform conductivity.

The basic compound (B) preferably includes at least one compound selected from the group consisting of a compound (b-1), a compound (b-2) and a compound (b-3), which are described below, because these compounds easily form a salt with the acidic group of the conductive polymer (A) to thereby improve the stability of the conductive polymer (A).

Compound (b-1): a basic compound having two or more nitrogen atoms.

Compound (b-2): a quaternary ammonium compound in which at least one of the four substituents bonded to the nitrogen atom is a hydrocarbon group having 1 or more carbon atoms.

Compound (b-3): a basic compound having a basic group and two or more hydroxy groups in the same molecule and having a melting point of 30° C. or higher.

(Compound (b-1))

The number of nitrogen atoms in the molecule of the compound (b-1) is preferably 2 to 6, and more preferably 2 to 3.

The compound (b-1) is not particularly limited as long as it has two or more nitrogen atoms, but it is preferable that the two or more nitrogen atoms are nitrogen atoms of a tertiary amine.

Further, the compound (b-1) preferably has a conjugated structure. When the compound (b-1) has a conjugated structure, a salt can be efficiently formed with the acidic group of the conductive polymer (A).

As the compound (b-1), a compound having two or more tertiary amines in the molecule and having a conjugated structure is more preferable.

Further, from the viewpoint of its diffusibility, the compound (b-1) preferably has a boiling point of 120° C. or higher.

In this context, the phrase "having two or more tertiary amines in the molecule" means that at least one of the tertiary amines is included in a conjugated structure, that is, a cyclic structure. Examples of the conjugated structure, that is, the cyclic structure, include an aromatic ring structure having 6 to 10 carbon atoms and an alicyclic structure having 5 to 15 carbon atoms.

Specific examples of the compound (b-1) include 4-aminopyridine, 4-dimethylaminopyridine, 4-dimethylaminomethylpyridine, 3,4-dimethylaminopyridine, 3,4-bis(dimethylamino)pyridine, 2-aminopyrazine, 2,3-diaminopyrazine, melamine, ammeline, ammelide, 1,5-diazabicyclo[4.3.0]-5-nonene (DBN), 1,8-diazabicyclo[5.4.0]-7-undecene (DBU), and derivatives thereof. Among these, from the perspective of water solubility, 4-dimethylaminopyridine, 4-dimethylaminomethylpyridine, 1,5-diazabicyclo[4.3.0]-5-nonene (DBN), and 1,8-diazabicyclo[5.4.0]-7-undecene (DBU) are preferable.

One of these compounds (b-1) may be used alone, or two or more of them may be used in the form of a mixture thereof with an appropriate blending ratio.

The amount of the compound (b-1) is preferably 1 to 100 mol %, more preferably 20 to 80 mol % and even more preferably 40 to 70 mol % per mol of a monomer unit having an acidic group among the monomer units constituting the conductive polymer (A). Particularly, when the amount of the compound (b-1) is 40 mol % or more, a salt can be sufficiently formed with the acidic group of conductive polymer (A). On the other hand, when the amount of the compound (b-1) is 80 mol % or less, the conductivity of the conductive film is further improved.

(Compound (b-2))

In the compound (b-2), the nitrogen atom to which the four substituents are bonded is a nitrogen atom of the quaternary ammonium ion.

Examples of the hydrocarbon group bonded to the nitrogen atom of the quaternary ammonium ion in the compound (b-2) include an alkyl group, an aralkyl group and an aryl group.

At least one of the four substituents bonded to the nitrogen atom is an alkyl group having 1 or more carbon atoms. From the perspective of improving the coatability of the conductive composition described below, at least one of the four substituents bonded to the nitrogen atom is preferably an alkyl group having 3 or more carbon atoms, and more preferably an alkyl group having 4 or more carbon atoms.

Examples of the compound (b-2) include tetramethylammonium hydroxide, tetraethylammonium hydroxide, tetrapropylammonium hydroxide, tetrabutylammonium hydroxide, tetrapentylammonium hydroxide, tetrahexylammonium hydroxide, benzyltrimethylammonium hydroxide, and the like. Among these, tetrabutylammonium hydroxide and tetrapropylammonium hydroxide are preferable for improving the water solubility.

One of these compounds (b-2) may be used alone, or two or more of them may be used in the form of a mixture thereof with an appropriate blending ratio.

The amount of the compound (b-2) is preferably 1 to 100 mol %, more preferably 20 to 80 mol % and even more preferably 30 to 75 mol % per mol of a monomer unit having an acidic group among the monomer units constituting the conductive polymer (A). When the amount of the compound (b-2) is within the range described above, the conductive polymer (A) can be more stabilized while maintaining good conductivity of the conductive film. Particularly, when the amount of the compound (b-2) is 80 mol % or less, the conductivity of the conductive film is further improved.

(Compound (b-3))

When the compound (b-3) has only a basic group in the same molecule, it becomes difficult to efficiently form a salt with the acidic group of the conductive polymer (A). On the other hand, when the compound (b-3) has only hydroxy groups in the same molecule, such a compound (b-3) cannot form a salt with the acidic group of the conductive polymer (A). Further, when the compound (b-3) has only one hydroxy group in the same molecule or its melting point is lower than 30° C., such a compound (b-3) cannot efficiently form a salt with the acidic group, for example because its fluidity in the conductive composition described below decreases.

The compound (b-3) preferably has three or more hydroxy groups in view of the ability to suppress migration of acidic groups to the resist layer, availability, and ease of production. Further, the upper limit of the number of hydroxy groups in the compound (b-3) is preferably 8 or less from the viewpoint of availability. That is, the number of hydroxy groups in the compound (b-3) is preferably 2 to 8, and more preferably 3 to 6.

The melting point of the compound (b-3) is preferably 50° C. or higher, more preferably 100° C. or higher, and still more preferably 150° C. or higher.

Too high a melting point of the compound (b-3) tends to make it difficult to efficiently form a salt with the acidic group, for example because the solubility of the compound (B-3) in a solvent decreases. Therefore, the melting point of the compound (b-3) is preferably 300° C. or lower, more preferably 250° C. or lower, and even more preferably 200° C. or lower. That is, the melting point of the compound (b-3) is preferably 30 to 300° C., more preferably 40 to 250° C., and even more preferably 50 to 200° C.

The basic group may be, for example, a basic group defined as an Arrhenius base, a Brønsted base, a Lewis base, etc.

The hydroxy group may be in the state of —OH or may be protected by a protective group. Examples of the protective groups include an acetyl group; a silyl group such as a trimethyl silyl group, a tert-butyl dimethyl silyl group, etc.; an acetal-type protective group such as a methoxymethyl group, an ethoxymethyl group, a methoxyethoxymethyl group, etc.; a benzoyl group; an alkoxide group, etc.

Examples of the compound (b-3) includes 2-amino-1,3-propanediol, tris(hydroxymethyl)aminomethane, 2-amino-2-methyl-1,3-propanediol, 2-amino-2-ethyl-1,3-propanediol, 3-[N-tris(hydroxymethyl)methylamino]-2-hydroxypropanesulfonic acid, and N-tris(hydroxymethyl) methyl-2-aminoethanesulfonic acid. Among these, tris (hydroxymethyl)aminomethane is preferable from the perspective of excellent water solubility and basicity.

One of these compounds (b-3) may be used alone, or two or more of them may be used in the form of a mixture thereof with an appropriate blending ratio.

The amount of the compound (b-3) is preferably 1 to 300 mol %, and more preferably 10 to 200 mol % per mol of a monomer unit having an acidic group among the monomer units constituting the conductive polymer (A). When the amount of the compound (b-3) is within the range described above, the conductive polymer (A) can be more stabilized while maintaining good conductivity of the conductive film.

As the basic compound (B), basic compounds other than the compound (b-1), the compound (b-2) and the compound (b-3) can also be used.

<Surfactant>

Examples of the surfactant include a water-soluble polymer (C) having a nitrogen-containing functional group and a terminal hydrophobic group in its molecule, an anionic surfactant, a cationic surfactant, an amphoteric surfactant, nonionic surfactants other than the water-soluble polymer (C) (other nonionic surfactants), and the like. Any one of these surfactants may be used alone, or two or more thereof may be mixed and used at an arbitrary ratio. Among these, the water-soluble polymer (C) is preferable because influence on the resist can be easily suppressed.

(Water-Soluble Polymer (C))

The water-soluble polymer (C) has a nitrogen-containing functional group and a terminal hydrophobic group in its molecule.

As described in detail below, the conductive film is formed by applying a conductive composition containing the conductive polymer (A) to a substrate or the like. Having a nitrogen-containing functional group and a terminal hydrophobic group within its molecule, the water-soluble polymer (C) can easily exhibit surface activity. Therefore, the conductive composition further including the water-soluble polymer (C) shows improved coatability on a substrate and the like. Moreover, while conventional surfactants (e.g., dodecylbenzene sulfonic acid) may have an adverse effect on the resist characteristics, such an adverse effect on the resist characteristics can be easily suppressed by the use of the water-soluble polymer (C).

As the nitrogen-containing functional group, an amide group is preferable from the perspective of solubility.

The carbon number of the terminal hydrophobic group is preferably 4 or more, and more preferably 8 or more.

The terminal hydrophobic group is preferably one having an alkyl chain, an aralkyl chain or an aryl chain in the hydrophobic group. Specifically, from the viewpoint of solubility and surface activity, the terminal hydrophobic group preferably contains at least one selected from the group consisting of an alkyl chain having 4 to 100 carbon atoms, an aralkyl chain having 4 to 100 carbon atoms, and an aryl chain having 4 to 100 carbon atoms. The number of carbon atoms of each of these alkyl chain, aralkyl chain and aryl chain is preferably 4 to 70, and more preferably 8 to 30.

Specific examples of such terminal hydrophobic groups include alkyl groups, aralkyl groups, aryl groups, alkoxy groups, aralkyloxy groups, aryloxy groups, alkylthio groups, aralkylthio groups, arylthio groups, primary or secondary alkylamino groups, aralkylamino groups, and arylamino groups. Among these, alkylthio groups, aralkylthio groups, and arylthio groups are preferable, and alkylthio groups are particularly preferable from the viewpoint of solubility and surface activity.

The water-soluble polymer (C) is preferably a homopolymer of a vinyl monomer having an amide bond, or a compound having a main chain structure formed of a copolymer of a vinyl monomer having an amide bond and a vinyl monomer having no amide bond (another vinyl monomer), and having a hydrophobic group at a site other than repeating units constituting the polymer.

Examples of the vinyl monomer having an amide bond include acrylamide and derivatives thereof, N-vinyl lactam and the like. Specific examples thereof include acrylamide, N,N-dimethyl acrylamide, N-isopropyl acrylamide, N,N-diethyl acrylamide, N,N-dimethylaminopropyl acrylamide, t-butyl acrylamide, diacetone acrylamide, N,N'-methylenebisacrylamide, N-vinyl-N-methyl acrylamide, N-vinyl pyrrolidone, N-vinyl caprolactam and the like. Among these, from the viewpoint of solubility, acrylamide, N-vinylpyrrolidone, N-vinylcaprolactam and the like are particularly preferable.

The method for introducing the terminal hydrophobic group into the water-soluble polymer (C) is not particularly limited as long as the effects of the present invention are obtained, but a method of introducing the terminal hydrophobic group by selecting a chain transfer agent for the vinyl polymerization is simple and preferable.

For example, the water-soluble polymer (C) having a nitrogen-containing functional group and a terminal hydrophobic group having 4 or more carbon atoms in its molecule can be produced by polymerizing a vinyl monomer having an amide bond and, if necessary, another vinyl monomer, in the presence of a polymerization initiator and a chain transfer agent having 4 or more carbon atoms.

The chain transfer agent is not particularly limited as long as the above-mentioned terminal hydrophobic group can be introduced and the effects of the present invention can be obtained, but it is preferable to use thiol, disulfide, thioether etc., with which an alkylthio group, an aralkylthio group, an arylthio group etc. which are preferable terminal hydrophobic groups can be easily introduced.

The number of repeating units of the main chain structure moiety of the water-soluble polymer (C), that is, the polymerization degree of the above-mentioned vinyl monomer having an amide bond, is preferably 2 to 100,000, more preferably 2 to 1000, and particularly preferably 3 to 200, from the perspective of the solubility of the water-soluble polymer (C).

From the viewpoint of surface activity, with respect to the water-soluble polymer (C), the ratio of a molecular weight of the main chain structure moiety (hereinafter also referred to as "molecular weight of water-soluble moiety") relative to a molecular weight of the terminal hydrophobic moiety (hereinafter also referred to as "molecular weight of hydrophobic moiety"), i.e., (molecular weight of water-soluble moiety)/(molecular weight of hydrophobic moiety), is preferably 1 to 1,500, and more preferably 5 to 1,000. The "molecular weight of water-soluble moiety" and "molecular weight of hydrophobic moiety" can be calculated from the weight average molecular weight of the obtained water-soluble polymer (C), and the compounding ratio of the monomer for constituting the main chain structure moiety and the chain transfer agent for constituting the terminal hydrophobic moiety.

The weight average molecular weight of the water-soluble polymer (C) is preferably 100 to 1,000,000, more preferably 100 to 100,000, even more preferably 400 or more and less than 2,000, and particularly preferably 600 to 1,800, in terms of polyethylene glycol in GPC. When the weight average molecular weight of the water-soluble polymer (C) is not less than 100, the effect of improving the coatability of the conductive composition described below can be more easily achieved. On the other hand, when the weight average molecular weight of the water-soluble polymer (C) is 1,000,000 or less, the water solubility is enhanced. In particular, when the weight average molecular weight of the water-soluble polymer (C) is 400 or more and less than 2000, an excellent balance is achieved between the practical solubility thereof in water and the coatability of the conductive composition.

The water-soluble polymer (C) is preferably a compound represented by the following formula (10) from the viewpoint of solubility and the like.

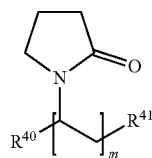

(10)

In the formula (10), each of $R^{40}$ and $R^{41}$ independently represents an alkylthio group, an aralkylthio group, an arylthio group or a hydrocarbon group, with the proviso that at least one of $R^{40}$ and $R^{41}$ is an alkylthio group, an aralkylthio group or an arylthio group; and m represents an integer of 2 to 100000.

Examples of the hydrocarbon group include a linear or branched alkyl group having 1 to 20 carbon atoms, a linear or branched alkenyl group having 2 to 20 carbon atoms, and a linear or branched alkynyl group having 2 to 20 carbon atoms.

The water-soluble polymer (C) may, in some cases, contain low molecular weight materials such as raw material monomers (residual monomers), oligomers resulting from side reactions, and various additives used in polymerization of the raw material monomers. These low molecular weight materials cause the deterioration of conductivity.

Therefore, it is preferable to purify the water-soluble polymer (C) to remove low molecular weight materials (residual monomers, oligomers, various additives, etc.). That is, the conductive film preferably contains a purified water-soluble polymer (C).

Whether or not the water-soluble polymer (C) contained in the conductive film is purified is determined by, for example, measuring the amount of the low molecular weight materials derived from the water-soluble polymer (C) in the conductive film with a high performance liquid chromatography mass spectrometer or the like, following the method described above. Specifically, when the area ratio calculated by the formula (1) is 0.44 or less, it can be confirmed that the water-soluble polymer (C) contained in the conductive film is purified.

The method for purifying the water-soluble polymer (C) is not particularly limited, and examples thereof include contacting with an adsorbent such as a hydrophobic substance (e.g., an octadecyl group-modified silica or an activated carbon), washing with a solvent, and filtration.

The amount of the water-soluble polymer (C) is preferably 5 to 200 parts by mass, and more preferably 10 to 100 parts by mass, with respect to 100 parts by mass of the conductive polymer (A). By thus adjusting the amount of the water-soluble polymer (C) and combining it with the conductive polymer (A), the conductivity becomes more uniform.

(Anionic Surfactant)

Examples of the anionic surfactant include sodium octanoate, sodium decanoate, sodium laurate, sodium myristate, sodium palmitate, sodium stearate, perfluorononanoic acid, sodium N-lauroylsarcosinate, sodium cocoyl glutamate, α-sulfo fatty acid methyl ester salt, sodium lauryl sulfate, sodium myristyl sulfate, sodium laureth sulfate, sodium polyoxyethylene alkylphenol sulfonate, ammonium lauryl sulfate, lauryl phosphate, sodium lauryl phosphate, and potassium lauryl phosphate.

(Cationic Surfactant)

Examples of the cationic surfactant include tetramethylammonium chloride, tetramethylammonium hydroxide, tetrabutylammonium chloride, dodecyldimethylbenzylammonium chloride, an alkyltrimethylammonium chloride, octyltrimethylammonium chloride, decyltrimethylammonium chloride, dodecyltrimethylammonium chloride, tetradecyltrimethylammonium chloride, cetyltrimethylammonium chloride, stearyltrimethylammonium chloride, an alkyltrimethylammonium bromide, hexadecyltrimethylammonium bromide, benzyltrimethylammonium chloride, benzyltriethylammonium chloride, benzalkonium chloride, benzalkonium bromide, benzethonium chloride, a dialkyldimethylammonium chloride, didecyldimethylammonium chloride, distearyldimethylammonium chloride, monomethylamine hydrochloride, dimethylamine hydrochloride, trimethylamine hydrochloride, butylpyridinium chloride, dodecylpyridinium chloride, and cetylpyridinium chloride.

(Amphoteric Surfactant)

Examples of the amphoteric surfactant include betaine lauryldimethylaminoacetate, betaine stearyldimethylaminoacetate, dodecylaminomethyldimethylsulfopropylbetaine, octadecylaminomethyldimethylsulfopropylbetaine, cocamidopropylbetaine, cocamidopropylhydroxysultaine, a 2-alkyl-N-carboxymethyl-N-hydroxyethylimidazolinium betaine, sodium lauroylglutamate, potassium lauroylglutamate, lauroylmethyl-β-alanine, lauryldimethylamine-N-oxide, and oleyldimethylamine N-oxide.

(Other Nonionic Surfactants)

Examples of other nonionic surfactants include glyceryl laurate, glyceryl monostearate, a sorbitan fatty acid ester, a sucrose fatty acid ester, a polyoxyethylene alkyl ether, pentaethylene glycol monododecyl ether, octethylene glycol monododecyl ether, a polyoxyethylene alkylphenyl ether, octylphenol ethoxylate, nonylphenol ethoxylate, polyoxyethylene polyoxypropylene glycol, a polyoxyethylene sorbitan fatty acid ester, a polyoxyethylene hexitan fatty acid ester, a sorbitan fatty acid ester polyethylene glycol, lauric acid diethanolamide, oleic acid diethanolamide, stearic acid diethanolamide, octyl glucoside, decyl glucoside, lauryl glucoside, cetanol, stearyl alcohol, and oleyl alcohol.

<Optional Components>

The conductive film may contain components (optional components) other than the conductive polymer (A), the basic compound (B), and the surfactant, if necessary, as long as the effect of the present invention is not impaired.

Examples of the optional components include polymeric compounds and additives.

Examples of the polymeric compound include polyvinyl alcohol derivatives and modified products thereof such as polyvinyl formal and polyvinyl butyral, starch and modified products thereof (oxidized starch, starch phosphate, cationized starch, etc.), cellulose derivatives (carboxymethyl cellulose, methyl cellulose, hydroxypropyl cellulose, hydroxyethyl cellulose and salts thereof, etc.), polyacrylamides such as polyacrylamide, poly(N-t-butyl acrylamide) and polyacrylamide methyl propane sulfonate, polyvinyl pyrrolidones, polyacrylic acids (and salts thereof), polyethylene glycol, water-soluble alkyd resins, water-soluble melamine resins, water-soluble urea resins, water-soluble phenol resins, water-soluble epoxy resins, water-soluble polybutadiene resins, water-soluble acrylic resins, water-soluble urethane resins, water-soluble acrylic styrene copolymer resins, water-soluble vinyl acetate acrylic copolymer resins, water-soluble polyester resins, water-soluble styrene maleic acid copolymer resins, water-soluble fluoro resins, and copolymers thereof.

Examples of the additive include a pigment, an antifoaming agent, an ultraviolet light absorber, an antioxidant, a heat resistance improver, a leveling agent, an antidripping agent, a matting agent, and a preservative.

<Production Method>

The conductive film is formed from the conductive composition containing the conductive polymer (A). An example of the method for producing the conductive film is described below.

The method of the present embodiment for producing the conductive film includes a step of coating the conductive composition containing the conductive polymer (A) on a substrate and drying it to form a coating film (coating step), and a step of heating the dried coating film (heating step).

Further, the method of the present embodiment for producing the conductive film may include a step of preparing the conductive composition (preparation step) prior to the coating step.

(Preparation Step)

The preparation step is a step of preparing the conductive composition.

The conductive composition can be obtained, for example, by mixing the conductive polymer (A) and a solvent (D). For producing a conductive film further containing the basic compound (B), the conductive composition is prepared by mixing the conductive polymer (A), the basic compound (B) and the solvent (D). Furthermore, when a surfactant such as the water-soluble polymer (C) is added to such a mixture, a conductive composition showing excellent coatability on a substrate can be obtained. Moreover, optional components may be added if necessary.

Examples of the conductive polymer (A), the basic compound (B), the surfactant such as the water-soluble polymer (C), and the optional components include those exemplified above.

As described above, the conductive polymer (A) may contain low molecular weight materials (polymerization residue) such as residual monomers or sulfate ions. These low molecular weight materials (polymerization residue) cause the deterioration of conductivity. Therefore, the conductive polymer (A) to be used is preferred to be a purified one. Specifically, it is preferable to use the polymerizable polymer (A) in which the amount of the polymerization residue derived from the conductive polymer (A) is 0.8% by mass or less, based on the total mass of the conductive polymer (A).

That is, the method for producing the conductive film may have a step of purifying the conductive polymer (A) prior to the preparation step.

The purified conductive polymer (A) shows a more excellent conductivity because the low molecular weight materials (polymerization residue) are sufficiently removed. Further, the conductive film formed using the conductive composition containing the purified conductive polymer (A) has a smaller standard deviation of the current value and more uniform conductivity. In addition, such a conductive film has excellent smoothness.

The conductive polymer (A) after purification is in a state of being dispersed or dissolved in an aqueous medium such as water. Therefore, a solid form of the conductive polymer (A) is obtained by entirely removing the aqueous medium with an evaporator or the like, but the conductive polymer (A) in a state of being dispersed or dissolved in a solvent may also be used for preparation of the conductive composition.

The water-soluble polymer (C) may, in some cases, contain low molecular weight materials such as residual monomers, oligomers resulting from side reactions, and various additives used in polymerization of the raw material monomers. These low molecular weight materials may aggregate in the conductive film to cause nonuniformity of the conductive film. Therefore, it is preferable to use a purified water-soluble polymer (C). That is, the method for producing the conductive film may have a step of purifying the water-soluble polymer (C) prior to the preparation step.

The use of a purified water-soluble polymer (C) results in more excellent conductivity because the low molecular weight materials are sufficiently removed. Further, the conductive film formed using the conductive composition containing the purified water-soluble polymer (C) has a smaller standard deviation of the current value and more uniform conductivity. In addition, such a conductive film has excellent smoothness.

The water-soluble polymer (C) after purification is in a state of being dispersed or dissolved in an aqueous medium such as water. Therefore, a solid form of the solid water-soluble polymer (C) is obtained by entirely removing the aqueous medium with an evaporator or the like, but the water-soluble polymer (C) in a state of being dispersed or dissolved in a solvent may also be used for preparation of the conductive composition.

The solvent (D) is not particularly limited as long as it can dissolve the conductive polymer (A) and the effects of the present invention can be obtained, and examples thereof include water and a mixed solvent of water and an organic solvent.

Examples of the organic solvent include alcohols such as methanol, ethanol, 2-propanol, 1-propanol and 1-butanol; ketones such as acetone, methyl ethyl ketone, ethyl isobutyl ketone and methyl isobutyl ketone; ethylene glycols such as ethylene glycol, ethylene glycol methyl ether and ethylene glycol mono-n-propyl ether; propylene glycols such as propylene glycol, propylene glycol methyl ether, propylene glycol ethyl ether, propylene glycol butyl ether and propylene glycol propyl ether; amides such as dimethylformamide and dimethylacetamide; pyrrolidones such as N-methylpyrrolidone and N-ethylpyrrolidone; and hydroxy esters such as methyl lactate, ethyl lactate, methyl β-methoxyisobutyrate and methyl α-hydroxyisobutyrate.

When a mixed solvent of water and an organic solvent is used as the solvent (D), the mass ratio of water to an organic solvent (water/organic solvent) is preferably 1/100 to 100/1, and more preferably 2/100 to 100/2.

When a conductive composition containing a high boiling point solvent as the solvent (D) is applied to a substrate or a resist layer described later, the substrate or the resist layer may be corroded. Therefore, the amount of the high boiling point solvent in the conductive composition is preferably 150 ppm by mass or less, and more preferably 100 ppm by mass or less, based on the total mass of the conductive composition. The amount of the high boiling point solvent in the conductive composition is preferred to be as small as possible.

In this context, the high boiling point solvent means an organic solvent having a boiling point of 100° C. or higher, and specific examples thereof include toluene, dimethyl sulfoxide, dimethylformamide, N-methylpyrrolidone, and the like.

The amount of the conductive polymer (A) in the conductive composition is preferably 0.01 to 95% by mass, and more preferably 0.05 to 90% by mass, based on the total mass of the conductive composition.

The amounts of the basic compound (B) and the water-soluble polymer (C) in the conductive composition are preferably such that the amount of the conductive polymer (A) falls within the above range.

The amount of water in the conductive composition is preferably 50% by mass or more, and more preferably 80 to 99.5% by mass, based on the total mass of the conductive composition.

(Coating Step)

The coating step is a step of coating the conductive composition containing the conductive polymer (A) on a substrate, followed by drying to form a coating film.

The substrate is not particularly limited as long as the effects of the present invention are obtained. Examples of the substrate include molded articles and films of various polymers such as polyester resins (e.g., PET and PBT), polyolefin resins represented by polyethylene and polypropylene, polyvinyl chloride, nylon, polystyrene, polycarbonate, epoxy resins, fluoro resins, polysulfone, polyimide, polyurethane, phenol resins, silicon resins, and synthetic papers; and papers, iron, glass, quartz glass, various wafers, aluminum, copper, zinc, nickel, stainless steel and the like; and products obtainable by coating surfaces of these substrates with various coating materials, photosensitive resins, resists and the like.

The shape of the substrate is not particularly limited and may be a plate or any other shape.

The application of the conductive composition to the substrate may be performed before or during the process of producing the substrate, such as uniaxial stretching, biaxial stretching, molding, or embossing, or may be performed on the produced substrate after the aforementioned process.

The conductive composition is coated on the substrate so that the thickness of the coating film after drying is 35 nm or less, and preferably 5 to 30 nm.

The method of applying the conductive composition to the substrate is not particularly limited as long as the effects of the present invention are obtained. Examples of the method include spin coating, spray coating, dip coating, roll coating, gravure coating, reverse coating, roll brush method, air knife coating and curtain coating.

(Heating Step)

The heating step is a step of heating the dried coating film.

The heating temperature is preferably in the range of 40° C. to 250° C., and more preferably in the range of 60° C. to 200° C., from the viewpoint of conductivity. Further, the time for heat treatment is preferably within 1 hour, and more preferably within 30 minutes, from the perspective of stability.

Instead of the heating step, the coating film may be allowed to stand at room temperature (25° C.) for 1 to 60 minutes.

<Effects>

The conductive film of the present invention described above has a uniform conductivity because the standard deviation of the current value is 5 or less. Therefore, the unevenness of conductivity depending on the position of the film can be reduced. Further, the use of the conductive film of the present invention can suppress the influence of the charge on the resist surface due to electron beam lithography or the like, so that the unevenness occurring depending on the position can be reduced and a uniform resist pattern can be formed.

The standard deviation of the current value tends to decrease as the film thickness of the conductive film decreases, but the smaller film thickness tends to lower the smoothness, which may result in nonuniform conductivity.

As described above, the use of the purified conductive polymer (A) in forming the conductive film can reduce the amount of low molecular weight materials derived from the conductive polymer (A) mixed into the conductive film, so that the standard deviation of the current value can be further reduced without excessively decreasing the film thickness. Therefore, a conductive film having more uniform conductivity can be obtained while maintaining the smoothness.

The use of a conductive polymer having an acidic group as the conductive polymer (A) in combination with the basic compound (B) results in formation of a salt between the acidic group of the conductive polymer (A) and the basic compound (B) and formation of a network structure between the molecules of the conductive polymer (A). This facilitates the current flow and results in more uniform conductivity.

In addition, a surfactant such as the water-soluble polymer (C) can be used in combination with the above components to improve the coatability of the conductive composition on the substrate. In particular, the water-soluble polymer (C) differs from conventional surfactants in that the water-soluble polymer (C) is capable of showing surface activity by the main chain structure moiety (water-soluble moiety) and the terminal hydrophobic group (hydrophobic moiety). Therefore, the water-soluble polymer (C) does not contain acids or bases, and is free of by-products formed by hydrolysis, whereby the water-soluble polymer (C) is unlikely to have an adverse effect on the resist and the like. Disposing the basic compound (B) and the water-soluble polymer (C) in the network structure of the conductive polymer (A) results in a more uniform conductive film being formed, which facilitates a more uniform current flow in the conductive film. In particular, the use of the purified water-soluble polymer (C) in forming the conductive film can reduce the amount of low molecular weight materials derived from the water-soluble polymer (C) mixed into the conductive film, so that the standard deviation of the current value can be further reduced without excessively decreasing the film thickness.

The conductive film of the present invention is suitable for antistatic use in charged particle beam lithography. Specifically, the conductive film of the present invention is formed on the surface of a resist layer for a charged particle beam pattern forming method using a chemically amplified resist. The conductive film thus formed serves as an antistatic film for the resist layer.

Further, the conductive film of the present invention can also be used as a material for capacitors, transparent electrodes, semiconductors, and the like.

[Conductor]

The conductor of the second aspect of the present invention has a substrate, and the conductive film of the first aspect of the present invention which is provided on at least a part of the surface of the substrate.

FIG. 1 is a cross-sectional view showing an example of the conductor of the second aspect of the present invention.

The conductor 10 of this example has a plate-shaped substrate 11 and a conductive film 12 provided on one surface of the substrate 11.

The conductive film 12 is the conductive film of the first aspect of the present invention described above.

Examples of the substrate 11 include those listed above in the explanation of the method for producing the conductive film.

The conductor 10 is obtained by forming the conductive film 12 on the substrate 11. The specific method is the same as in the method for forming the conductive film. That is, the conductor 10 is produced through the coating step and the heating step. Further, the preparation step may be performed prior to the coating step.

The conductor of the second aspect of the present invention has the conductive film of the first aspect of the present invention and hence has uniform conductivity.

The specific configuration of the conductor of the second aspect of the present invention is not limited to that described above. For example, in the case of the conductor 10 shown in FIG. 1, the conductive film 12 is laminated on the entire surface of one side of the plate-shaped substrate 11, but the conductive film 12 may be laminated on a part of one surface of the substrate 11, or may be laminated on at least a part of the other surface of the substrate 11 as well. Further, the conductive film 12 may be laminated on at least a part of the sides of the substrate 11. Furthermore, the conductive film may be laminated on at least a part of the surface of a substrate having a shape other than a plate shape.

[Method for Forming Resist Pattern]

Third Embodiment

The method of the third aspect of the present invention for forming a resist pattern includes:
 a lamination step of forming the conductive film of the first aspect of the present invention on a surface of a resist layer including a chemically amplified resist, said resist layer formed on one surface of a substrate,
 an exposure step of irradiating the substrate with an electron beam according to a pattern on its side on which the conductive film is formed,
 a post-exposure baking (hereinafter also referred to as PEB) step of heating the substrate after the exposure step, and
 a washing/developing step of removing the conductive film by washing with water after the PEB step and developing the resist layer to form a resist pattern.

(Lamination Step)

The lamination step is a step of forming the conductive film of the first aspect of the present invention on a surface of a resist layer including a chemically amplified resist, said resist layer formed on one surface of a substrate.

The substrate is not particularly limited as long as the effects of the present invention are obtained. Examples of the substrate include glass, quartz glass, various wafers, aluminum, copper, zinc, nickel, tantalum, stainless steel, etc., and products obtainable by coating surfaces of these substrates with various coating materials, photosensitive resins.

A resist layer made of a positive or negative chemically amplified resist is provided on one surface of the substrate.

The positive chemically amplified resist is not particularly limited as long as it has sensitivity to an electron beam, and known ones can be used. Typically, those containing an acid generator that generates an acid upon irradiation with an electron beam and a polymer containing a structural unit having an acid-decomposing group are used.

A positive resist layer can be formed by a known method. For example, a positive resist layer can be formed by applying an organic solvent solution of a chemically amplified resist on one surface of a substrate, followed by heating (prebaking) as necessary.

The negative chemically amplified resist is not particularly limited as long as it has sensitivity to an electron beam, and known ones can be used. Typically, those containing an acid generator that generates an acid upon irradiation with an electron beam, a polymer soluble in a developing solution, and a crosslinking agent are used.

As in the case of the positive resist layer, a negative resist layer can be formed by a known method.

The conductive film is formed by coating the above-mentioned conductive composition on the surface of the resist layer, followed by drying to form a coating film, and subjecting the dried coating film to a heat treatment if necessary. Thus, a laminate in which the substrate, the resist layer, and the conductive film are laminated in this order is obtained.

Examples of the method of coating the conductive composition and the conditions of the heat treatment include the coating method and the conditions for the heat treatment which are exemplified above in the description of the method for producing the conductive film.

The thickness of the conductive film is 35 nm or less, and preferably 5 to 30 nm.

(Exposure Step)

The exposure step is a step of irradiating the substrate with an electron beam from the conductive film side according to an intended pattern.

By the exposure step, a latent image is formed on the resist layer between the substrate and the conductive film.

During this process, since the conductive film is provided on the surface of the resist layer, the substrate can be grounded to the conductive film and the entire substrate can be prevented from being charged. As a result, the displacement of the electrons entering into the resist layer, which is caused under the influence of charging, can be suppressed, whereby a latent image corresponding to the target resist pattern can be formed with high precision.

(PEB Step)

The PEB step is a step of heating the substrate (PEB) after the exposure step.

With respect to the consequence of heating the substrate irradiated with the electron beam in the exposure step, in the case of a positive resist layer, the reaction by the action of the acid generated from the acid generator is promoted in the electron beam-irradiated section (exposed section), to thereby increase the solubility thereof in the developing solution. On the other hand, in the case of a negative resist layer, conversely, the solubility of the exposed section in the developing solution decreases.

The substrate can be heated by a known method such as one using a hot plate. The suitable heating conditions differ depending on the resist, but is preferably 200° C. or lower and within 1 hour from the viewpoint of the heat resistance of the conductive film.

(Washing/Developing Process)

The washing/developing step is a step of removing the conductive film by washing with water after the PEB step and developing the resist layer to form a resist pattern.

Since the conductive film is water-soluble, the conductive film is dissolved away by washing with water.

The washing with water indicates contacting with an aqueous liquid. Examples of the aqueous liquid include water, water containing at least one of a base and a basic salt, water containing an acid, and a mixture of water and a water-soluble organic solvent.

When a positive resist layer is developed, the positive resist layer's section irradiated with electron beam (exposed section) is dissolved away, to form a resist pattern composed of the positive resist layer's section not irradiated with electron beam (unexposed section).

On the other hand, when a negative resist layer is developed, the negative resist layer's section not irradiated with electron beam (unexposed section) is dissolved away, to form a resist pattern composed of the negative resist layer's section irradiated with electron beam (exposed section).

The washing/developing step can be performed, for example, by the following method (α) or (β).

Method (α): An alkaline developing solution is used for the washing with water, to thereby perform removal of the conductive film together with development of the resist layer.

Method (β): Only the conductive film is removed by the washing with water, and then the resist layer is developed with a developing solution.

The alkaline developing solution (aqueous alkali solution) used in the method (α) is not particularly limited, and a known one can be used. Examples thereof include an aqueous tetramethylammonium hydroxide solution and the like.

The washing with water in the method (β) can be performed using an aqueous solution that is not a developing solution, such as water. The development can be performed using an alkaline developing solution as in the method (α).

Other Embodiments

The resist pattern forming method of the third aspect may include a step of storing the substrate (storage step) between the laminating step and the exposure step.

When a storage period is provided after the laminating step, the resist layer is affected by the conductive film during that period, and the film thickness of the resist layer at its unirradiated section after development tends to decrease as compared to the case where no storage period is provided.

The storage conditions such as storage period, temperature, and humidity during the storage step are not particularly limited as long as the effect of the present invention can be obtained, but are preferably 2 months or less, 5° C. to 30° C., and 70% or less.

Further, after the washing/developing step, the substrate may be rinsed with pure water or the like, if necessary.

After the washing/developing step or the rinse treatment, the substrate on which the resist pattern is formed may be heated (post-baked), if necessary.

<Fourth Aspect>

The method of the fourth aspect of the present invention for forming a resist pattern includes:

a lamination step of forming the conductive film of the first aspect of the present invention on a surface of a resist layer including a chemically amplified resist, said resist layer formed on one surface of a substrate, an exposure step of irradiating the substrate with an electron beam according to a pattern on its side on which the conductive film is formed, a washing step of removing the conductive film by washing with water after the exposure step, a post-exposure baking step (PEB step) of heating the substrate after the washing step, and a developing step of developing the resist layer to form a resist pattern after the PEB step.

The resist pattern forming method of the fourth aspect is the same as the resist pattern forming method of the third aspect, except that the removal of the conductive film by washing with water is performed after the exposure step and before the PEB step.

The presence of the conductive film during the PEB may results in migration of acidic substances or basic substances in the conductive film into the resist layer due to heat, which may affect the resist pattern. In the resist pattern forming method of the fourth aspect, by removing the conductive film before the PEB step, it is possible to prevent the resist layer from being affected by the conductive film during the PEB, so that a resist pattern with less influence from the conductive film can be formed.

The washing step can be carried out in the same manner as in the washing/developing step in the resist pattern forming method of the third aspect.

The resist pattern forming method of the fourth aspect may include a step of storing the substrate (storage step) between the laminating step and the exposure step. The storage step can be carried out in the same manner as in the storage step in the resist pattern forming method of the third aspect.

Further, after the developing step, the substrate may be rinsed with pure water or the like, if necessary.

After the developing step or the rinse treatment, the substrate on which the resist pattern is formed may be heated (post-baked), if necessary.

<Effects>

According to the resist pattern forming methods of the third and fourth aspects of the present invention which are described above, the exposure step is performed with the conductive film of the first aspect of the present invention being provided on the surface of the resist layer, so that it is possible to prevent the entire substrate from being charged. As a result, the displacement of the electrons entering into the resist layer, which is caused under the influence of charging, can be suppressed, whereby a latent image corresponding to the target resist pattern can be formed with high precision. Moreover, since the conductive film of the first aspect of the present invention has uniform conductivity, uneven exposure is unlikely to occur, and a uniform resist pattern can be formed.

[Method for Producing Patterned Substrate]

A method for producing a patterned substrate include a step of forming a resist pattern by the resist pattern forming method of the third or fourth aspect of the present invention to obtain a substrate having a resist pattern formed on one surface thereof (hereinafter, referred to as a resist pattern forming step).

By the resist pattern forming step, a substrate having a resist pattern on one surface thereof is obtained.

The method for producing a patterned substrate may further include a step (etching step) of etching the obtained substrate using the resist pattern as a mask after the resist pattern forming step.

Further, when the resist pattern remains on the substrate after the etching step, the method may further include a step of removing the resist pattern on the substrate with a removing agent.

Thus, a patterned substrate is obtained. For example, using a substrate provided with a transparent substrate and a light-shielding film provided on the surface thereof, a photomask can be produced by etching the light-shielding film in the etching step.

[Laminate]

The laminate of the fifth aspect of the present invention has a resist layer and an antistatic film formed on the surface of the resist layer.

Figure 2:
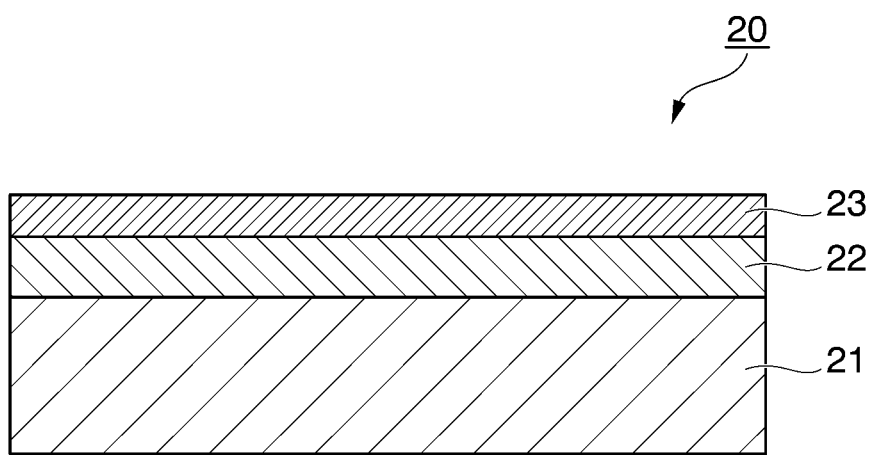
FIG. 2 is a cross-sectional view showing an example of the laminate of the present invention.

FIG. 2 is a cross-sectional view showing an example of the laminate of the fifth aspect of the present invention.

The laminate 20 of this example includes a plate-shaped substrate 21, a resist layer 22 provided on one surface of the substrate 21, and an antistatic film 23 provided on the resist layer 22.

Examples of the substrate 21 include the substrates exemplified above in the description of the resist pattern forming method of the third aspect of the present invention.

Examples of the resist layer 22 include the resist layers exemplified above in the description of the resist pattern forming method of the third aspect of the present invention.

The antistatic film 23 is formed of the conductive film of the first aspect of the present invention described above.

The laminate 20 is obtained by forming the resist layer 22 and the antistatic film 23 on the substrate 21 in this order. The specific production method is the same as the laminating step of the resist pattern forming method of the third aspect of the present invention.

The laminate of the fifth aspect of the present invention has an antistatic film which is the conductive film of the first aspect of the present invention and hence has uniform conductivity.

Other embodiments of the present invention are as enumerated below.

<1> A conductive film including a conductive polymer (A) and having a film thickness of 35 nm or less, wherein: a surface resistivity of the conductive film is $1 \times 10^{11}$ Ω/sq. or less, and a standard deviation of current that flows through the conductive film upon application of voltage to the conductive film is 5 or less.

<2> The conductive film according to <1>, which further includes a basic compound (B).

<3> The conductive film according to <2>, wherein the basic compound (B) includes at least one compound selected from the group consisting of the compound (b-1), the compound (b-2) and the compound (b-3).

<4> The conductive film according to <3>, wherein the amount of the compound (b-1) is 1 to 100 mol % per mol of a monomer unit having an acidic group among the monomer units constituting the conductive polymer (A).

<5> The conductive film according to <4>, wherein the amount of the compound (b-2) is 1 to 100 mol % per mol of a monomer unit having an acidic group among the monomer units constituting the conductive polymer (A).

<6> The conductive film according to any one of <3> to <5>, wherein the amount of the compound (b-3) is 1 to 300 mol % per mol of a monomer unit having an acidic group among the monomer units constituting the conductive polymer (A).

<7> The conductive film of <3> to <6>, wherein the basic compound (B) contains at least one of 1,5-diazabicyclo[4.3.0]-5-nonene (DBN) and tetrabutylammonium hydroxide.

<8> The conductive film according to any one of <1> to <7>, which further includes a surfactant.

<9> The conductive film according to <8>, wherein the surfactant includes a water-soluble polymer (C) having a nitrogen-containing functional group and a terminal hydrophobic group in its molecule.

<10> The conductive film according to <9>, wherein the water-soluble polymer (C) is a compound represented by the formula (10).

<11> The conductive film according to <9> or <10>, wherein the amount of the water-soluble polymer (C) is 5 to 200 parts by mass with respect to 100 parts by mass of the conductive polymer (A).

<12> The conductive film of any of <9> to <11>, wherein a peak area ratio is 0.44 or less, which is determined by formula (I) below based on results of analysis performed by the following measurement method using a high performance liquid chromatograph mass spectrometer.

(Measurement Method)

A test solution (β) obtained by extracting the water-soluble polymer (C) from an aqueous solution obtained by dissolving the conductive film in water with an organic solvent (β) is analyzed using a high performance liquid chromatograph mass spectrometer, and a peak area ratio is calculated by formula (I): In this context, the organic solvent (β) is any one of n-butanol, butyl acetate, and methyl isobutyl ketone.

$$\text{Area ratio} = Y/(X+Y) \tag{I}$$

wherein X is a total peak area of an extracted ion chromatogram prepared with respect to ions derived from compounds having a molecular weight (M) of 600 or more from a total ion current chromatogram, Y is a total peak area of an extracted ion chromatogram prepared with respect to ions derived from compounds having a molecular weight (M) of less than 600 from the total ion current chromatogram.

<13> The conductive film according to any one of <1> to <12>, wherein the conductive polymer (A) has an acidic group.

<14> The conductive film according to <13>, wherein the conductive polymer (A) has a monomer unit represented by the formula (1).

<15> The conductive film according to any one of <1> to <14>, wherein the amount of the low molecular weight materials derived from the conductive polymer (A) is 5% by mass or less, based on a total mass of the conductive polymer (A) in the conductive film. In this context, the low molecular weight materials derived from the conductive polymer (A) encompass raw material monomers (residual monomers) of the conductive polymer (A) and a sulfate ion, and a sulfate ion is a free acidic group eliminated from the conductive polymer (A) or a decomposition product from an oxidant used for polymerization of the raw material monomers.

<16> The conductive film according to any one of <1> to <15>, which has an arithmetic average roughness (Ra) of 0.7 nm or less.

<17> The conductive film of any one of <1> to <16>, which is for antistatic use in charged particle beam lithography.

<18> A method for producing the conductive film of any one of <1> to <17>, wherein the conductive film is formed using a conductive composition including the conductive polymer (A), the solvent (D) and, if necessary, at least one of the basic compound (B), the surfactant and the optional components.

<19> The method according to claim <18>, wherein an amount of a polymerization residue derived from the conductive polymer (A) in the conductive composition is 0.8% by mass or less, based on a total mass of the conductive polymer (A).

<20> The method according to claim <18> or <19>, wherein an amount of a high boiling point solvent in the conductive composition is 150 ppm by mass or less, based on a total mass of the conductive composition, and the high boiling point solvent has a boiling point of 180° C. or higher.

<21> The method according to any one of <18> to <19>, which has a water content of 50% by mass or more, based on a total mass of the conductive composition.

<22> A conductor including a substrate, and the conductive film of any one of <1> to <17> which is formed on at least a part of surface of the substrate.

<23> A method for forming a resist pattern, including a lamination step of forming the conductive film of any one of <1> to <17> on a surface of a resist layer comprising a chemically amplified resist, said resist layer formed on one surface of a substrate, and an exposure step of irradiating the substrate with an electron beam according to a pattern on its side on which the conductive film is formed.

<24> A laminate having a resist layer and an antistatic film formed on the surface of the resist layer, wherein the antistatic film is the conductive film of any one of <1> to <17>.

EXAMPLES

Hereinbelow, the present invention will be specifically described in more detail by way of Examples which should not be construed as limiting the present invention.

The various measurements and evaluations were performed in the Examples and Comparative Examples by respective methods as described below.
<Measurement and Evaluation Methods>
(Measurement of Film Thickness)

The film thickness of the conductive film was measured using a stylus profilometer (Stylus profiler P-16+, manufactured by KLA-Tencor Corporation).

(Measurement of Surface Resistivity)

The surface resistivity of the conductive film was measured by 2-terminal method (distance between the electrodes=20 mm) using Hiresta MCP-HT260 (manufactured by Mitsubishi Chemical Analytech Co., Ltd.).

(Measurement of Amount of Polymerization Residue Derived from Conductive Polymer (A))

The amount of the polymerization residue derived from the conductive polymer (A) was measured by means of ion chromatography (IC). Specifically, a test solution was prepared by adding an eluent to an aqueous solution of the conductive polymer (A) with its solids concentration being adjusted to 2% by mass. The concentration of the polymerization residue of the conductive polymer (A) was measured by means of TC to obtain a chromatogram. The area or height of the peak corresponding to the polymerization residue on this chromatogram was read, and the amount of the polymerization residue in the conductive polymer (A) was determined from a calibration curve prepared in advance.

<IC Measurement Conditions>>
  Device: Ion Chromatograph IC-2010 (manufactured by Tosoh Corporation)
  Column: TSKguard Column Super IC-Anion HS C-No W00052
  Eluent: a mixed solution of an aqueous sodium carbonate solution having a solids concentration of 1.8 mmol/L and an aqueous sodium hydrogen carbonate solution having a solids concentration of 1.7 mmol/L (mass ratio 1:1)
  Flow rate: 1.5 ml/min
  Measurement temperature: 40° C.
  Sample injection volume: 30 µl (Measurement 1 of Amount of Low Molecular Weight Materials: Low Molecular Weight Materials Derived from Conductive Polymer (A))

Using a test solution (α) which was an aqueous solution obtained by dissolving the conductive film in water with the solids concentration being adjusted to 2% by mass, the following eluent was added to the test solution (α) to carry out the measurement under the following ion chromatography (IC) measurement conditions. The areas or heights of the peaks corresponding to the residual monomers and the sulfate ions on this chromatogram were read, and the amounts of the low molecular weight materials in the conductive polymer (A) were determined from a calibration curve prepared in advance.

<<IC Measurement Conditions>>
  Device: Ion Chromatograph TC-2010 (manufactured by Tosoh Corporation)
  Column: TSKguard Column Super IC-Anion HS C-No W00052
  Eluent: a mixed solution of an aqueous sodium carbonate solution having a solids concentration of 1.8 mmol/L and an aqueous sodium hydrogen carbonate solution having a solids concentration of 1.7 mmol/L (mass ratio 1:1)
  Flow rate: 1.5 ml/min
  Measurement temperature: 40° C.
  Sample injection volume: 30 µl (Measurement 2 of Amount of Low Molecular Weight Materials: Low Molecular Weight Materials Derived from Water-Soluble Polymer (C))

1 ml of n-butanol was added to 2 ml of an aqueous solution obtained by dissolving the conductive film in water with the solids concentration being adjusted to 2% by mass, and the resulting mixture was subjected to shake extraction to separate the mixture into two layers. From the resulting, the supernatant n-butanol layer was recovered. The recovered n-butanol layer was used as a test solution (β), and the measurement was performed under the following LC-MS measurement conditions.

From the total ion current chromatogram, an extracted ion chromatogram was prepared with respect to ions derived from the respective compounds, and respective peak areas were determined. From the total peak area (X) ascribed to compounds having a molecular weight (M) of 600 or more, and the total peak area (Y) ascribed to compounds having a molecular weight (M) of less than 600, the peak area ratio (Y/(X+Y)) was calculated.

<<LC-MS Measurement Conditions>>
  Device: mass spectrometer of LC/1200 series/6220A time-of-flight mass spectrometer (manufactured by Agilent Technologies)
  Column: CAPCELL PAK C18 AQ (3 µm, 2.0×250 mm) (manufactured by Shiseido Company, Limited)
  Eluent A: water containing 0.1% formic acid
  Eluent B: acetonitrile containing 0.1% formic acid/isopropyl alcohol=1/1 (v/v)
  Gradient elution conditions: linear gradient 0 minutes (eluent A/eluent B=98/2)-55 minutes (eluent A/eluent B=0/100)-75 minutes (eluent A/eluent B=0/100)
  Flow rate: 0.2 m/min
  Measurement temperature: 40° C.
  Sample injection volume: 5 µl
<<Mass Spectrometry>>
  Ionization method: ESI
  Polarity: Positive ion
  Capillary voltage: 3500 V
  Fragmenter voltage: 150 V
  Nebulizer pressure: 50 psig
  Drying gas temperature: 350° C.
  Drying gas flow rate: 10 L/min (Measurement of Current)

The conductive film was peeled off from a conductor, and was fixed on a conductive sample stage using a silver paste. Using a scanning probe microscope ("SPA400" manufactured by Hitachi High-Tech Science Corporation), a constant voltage is applied between the probe and the conductive film under the following measurement conditions, and the current value was measured by scanning the measurement area while measuring and imaging the current value from the probe. The average value of the current values and the standard deviation of the current values were determined.

<<Measurement Conditions>>
  Measurement mode: Nano Current AFM (combined with SIS mode)
  Cantilever: SI-DF3-R
  Voltage: −0.2V (Example 1, Comparative Examples 1 and 2) or −1.0V (Examples 2 to 5)
  Measurement range: 0.5×1 µm
  Number of measurement points: 64×128 points (Evaluation of Smoothness)

The arithmetic mean roughness (Ra) of the conductive film was measured under the following measurement conditions using a scanning probe microscope ("SPI4000/SPA400" manufactured by Seiko Instruments Inc.).

<<Measurement Conditions>>
  Cantilever: SI-DF20
  Measurement mode: Tapping mode
  Scanning range: 1 µm×1 µm
  Scanning speed: 0.6 Hz (Evaluation by Resist Loss Test)
<<Measurement of Resist Loss>>

Using a chemically amplified electron beam resist (hereinafter simply referred to as "resist"), the resist loss of a resist layer was measured following the steps (1A) to (8A) described below.

(1A) Formation of resist layer: A resist was spin-coated onto a 4-inch silicon wafer so as to give a resist thickness of 0.2 µm using a spin coater at 2000 rpm for 60 seconds, followed by pre-baking at 130° C. for 90 seconds on a hot plate to remove the solvent and form a resist layer on the substrate.

(2A) Resist layer thickness measurement 1: A part of the resist layer formed on the substrate was peeled off, and the film thickness a [nm] of the resist layer in its initial state was measured using a stylus profilometer (Stylus profiler P-16+, manufactured by KLA-Tencor Corporation), taking the substrate surface as a reference position.

(3A) Formation of conductive film: 2 mL of the conductive composition was dropped on the resist layer and spin-coated under a condition of 2000 rpm×60 seconds by a spin coater so as to cover the entire surface of the resist layer, followed by pre-baking on a hot plate at 80° C. for 2 minutes to remove the solvent and form a conductive film having a thickness of about 30 nm on the resist layer.

(4A) PEB treatment: The substrate on which the conductive film and the resist layer were laminated was heated on the hot plate at 120° C. for 20 minutes in an air atmosphere, and the resulting substrate as such was allowed to stand in air at room temperature (25° C.) for 90 seconds.

(5A) Washing with water: The conductive film was washed away by running 20 mL of water, and the substrate was spun at 2,000 rpm for 60 seconds using a spin coater to remove water from the surface of the resist layer.

(6A) Development: 20 mL of a developing solution which was an aqueous solution of 2.38% by mass of tetramethylammonium hydroxide (TMAH) was dropped on the surface of the resist layer. After left standing for 60 seconds, the developing solution was removed from the surface of the resist layer by spinning the spin coater at 2000 rpm for 60 seconds, and the resulting was subsequently dried by allowing the spin coater to keep on spinning for 60 seconds.

(7A) Resist layer thickness measurement 2: A part of the resist layer was peeled off at a position located within 5 mm from the part where the resist layer had been peeled off in (2A) above, and the film thickness b [nm] of the resist layer after the development was measured using the stylus profilometer.

(8A) Calculation of resist loss: The value of the film thickness b was subtracted from the value of the film thickness a to calculate the resist loss c [nm] (c=a−b) of the resist layer.

<<Measurement of Reference Resist Loss>>

With respect to resist layers, there is a resist loss d [nm] peculiar to each resist depending on the storage period after the formation of the resist layer (hereinafter referred to as "reference resist loss"). This reference resist loss d which is not affected by the conductive film was measured following the steps (1B) to (6B) described below.

(1B) Formation of resist layer: A resist layer was formed on a substrate in the same manner as in (1A) above.

(2B) Resist layer thickness measurement 1: The initial film thickness a [nm] of the resist layer was measured in the same manner as in (2A) above.

(3B) PEB treatment: Baking was carried out in the same manner as in (4A) above, except that the substrate having the resist layer laminated thereon was used.

(4B) Development: Development was carried out in the same manner as in (6A) above.

(5B) Resist layer thickness measurement 2: A part of the resist layer was peeled off at a position located within 5 mm from the part where the resist layer had been peeled off in (2B) above, and the film thickness e [nm] of the resist layer after the development was measured using the stylus profilometer.

(6B) Calculation of resist loss: The value of the film thickness e was subtracted from the value of the film thickness a to calculate the resist loss d [nm] (d=a−e) of the resist layer.

The reference resist loss d of the resist layer was 3 nm.

<<Calculation of Resist Loss of Resist Layer Due to Components in Conductive Film>>

By subtracting the value of reference resist loss d of the resist layer from the value of resist loss c of the resist layer, the resist loss f of the resist layer [nm] (f=c−d), which was caused by molten additives migrated from the conductive film to the resist layer, was calculated and evaluated according to the following evaluation criteria. The resist loss f is preferred to be as small as possible, and A is regarded as having passed the test.

A: Resist loss f is less than 10 nm.
B: Resist loss f is not less than 10 nm.

Production Example 1: Production of Conductive Polymer (A-1)

100 mmol of 2-aminoanisole-4-sulfonic acid was dissolved in 4 mol/L of an aqueous ammonia solution at 25° C. to obtain a monomer solution. 100 mmol of an aqueous solution of ammonium peroxodisulfate was dropped into the obtained monomer solution. After completion of the dropwise addition, the resulting mixture was further stirred at 25° C. for 12 hours to obtain a reaction mixture containing a conductive polymer. Thereafter, the conductive polymer was separated from the reaction mixture by a centrifugal filter. The obtained conductive polymer was washed with methanol and then dried to obtain 15 g of a powdery conductive polymer (A-1).

The amount of the polymerization residue in the obtained conductive polymer (A-1) was measured, and found to be 0.9% by mass, based on the total mass of the conductive polymer (A-1).

Production Example 2: Production of Conductive Polymer (A-2)

10 parts by mass of the conductive polymer (A-1) obtained in Production Example 1 was dissolved in 100 parts by mass of water to obtain a polymer solution.

A mixture (mass ratio 1:1) of a cation exchange resin ("Orlite DS-1" manufactured by Organo Corporation) and an anion exchange resin ("Orlite DS-2" manufactured by Organo Corporation), which had been washed with ultrapure water, was charged into a column such that the amount of the mixture was 50 parts by mass with respect to 100 parts by mass of the polymer solution.

The polymer solution was passed through this column for cation exchange treatment to obtain a purified conductive polymer (A-2). The conductive polymer (A-2) was in the form of an aqueous solution in water, and the amount of the conductive polymer (A-2) was 2.0% by mass with respect to the total mass of the aqueous solution of the conductive polymer (A-2).

The amount of polymerization residue in the obtained conductive polymer (A-2) was measured and found to be 0.3% by mass with respect to the total mass of the conductive polymer (A-2).

Production Example 3: Production of Water-Soluble Polymer (C-1)

55 g of N-vinylpyrrolidone as a vinyl monomer having a nitrogen-containing functional group, 3 g of azobisisobutyronitrile as a polymerization initiator, and 1 g of n-dodecyl mercaptan as a chain transfer agent for introducing a terminal hydrophobic group were dissolved in 100 ml of isopropyl alcohol as a solvent with stirring to obtain a reaction solution. Then, the reaction solution was dropped into 100 ml of isopropyl alcohol, which had been heated to 80° C. in advance, at a dropping rate of 1 ml/min to carry out a drop polymerization. The drop polymerization was carried out while keeping the temperature of isopropyl alcohol at 80° C. After the dropping was completed, the resulting was matured at 80° C. for another 2 hours and then allowed to cool. Then, the resulting was concentrated under reduced pressure, and the obtained reaction product was redissolved in a small amount of acetone. A white precipitate obtained by dropping an acetone solution of this reaction product into an excess amount of n-hexane was filtered off, washed with n-hexane and then dried to obtain 45 g of a water-soluble polymer (C-1).

Production Example 4: Production of Water-Soluble Polymer (C-2)

5 g of the water-soluble polymer (C-1) was weighed into a beaker, followed by addition of 95 g of ultrapure water and stirring to obtain an aqueous solution of the water-soluble polymer. Further, the aqueous solution of the water-soluble polymer was filtered through a 50 nm polyethylene filter to obtain an aqueous solution of the water-soluble polymer (C-2). The water-soluble polymer (C-2) was in the form of an aqueous solution in water, and the amount of the water-soluble polymer (C-2) was 4.5% by mass with respect to the total mass of the aqueous solution of the water-soluble polymer (C-2).

Example 1

<Preparation of Conductive Composition>

A conductive composition was prepared by mixing 14.5 g of an aqueous solution of the conductive polymer (A-2), 0.67 g of an aqueous solution of the water-soluble polymer (C-2), 80.83 g of ultrapure water, and 4 g of isopropyl alcohol.

Table 1 shows the composition (in terms of pure contents) of the obtained conductive composition.

Using the obtained conductive composition, the resist loss test was carried out. The results are shown in Table 1.

<Production of Conductor>

After spin-coating the obtained conductive composition (2000 rpm×60 seconds) on a 2-inch silicon wafer as a substrate, heat treatment was performed on a hot plate at 80° C. for 2 minutes to form a conductor composed of a 10 nm-thick conductive film formed on the substrate.

Using the obtained conductor, the surface resistivity, current value and arithmetic mean roughness (Ra) of the conductive film were measured. Further, the amount of the low molecular weight materials in the conductive film was determined. The results are shown in Table 1.

Example 2

A conductive composition was prepared by mixing 14.5 g of an aqueous solution of the conductive polymer (A-2), 0.10 g of 1,5-diazabicyclo[4.3.0]-5-nonene (DBN) as the basic compound (B), 5.78 g of an aqueous solution of the water-soluble polymer (C-2), 75.62 g of ultrapure water, and 4 g of isopropyl alcohol so that their amounts in terms of pure contents matched the values shown in Table 1. Using the obtained conductive composition, the resist loss test was carried out. The results are shown in Table 1.

A conductor was produced and various measurements were performed in the same manner as in Example 1, except that the obtained conductive composition was used. The results are shown in Table 1.

Example 3

A conductive composition was prepared by mixing 14.5 g of an aqueous solution of the conductive polymer (A-2), 0.20 g of tetrabutylammonium hydroxide (TBAH) as the basic compound (B), 2.89 g of an aqueous solution of the water-soluble polymer (C-2), 78.41 g of ultrapure water, and 4 g of isopropyl alcohol so that their amounts in terms of pure contents matched the values shown in Table 1.

A conductor was produced and various measurements were performed in the same manner as in Example 1, except that the obtained conductive composition was used. The results are shown in Table 1.

Example 4

A conductive composition was prepared by mixing 14.5 g of an aqueous solution of the conductive polymer (A-2), 81.50 g of ultrapure water, and 4 g of isopropyl alcohol so that their amounts in terms of pure contents matched the values shown in Table 1.

A conductor was produced and various measurements were performed in the same manner as in Example 1, except that the obtained conductive composition was used. The results are shown in Table 1.

Example 5

After spin-coating the conductive composition obtained in Examples 2 on a 2-inch silicon wafer as a substrate at 800 rpm for 60 seconds, heat treatment was performed on a hot plate at 80° C. for 2 minutes to form a conductor composed of a 30 nm-thick conductive film formed on the substrate. Using the obtained conductor, various measurements were performed. The results are shown in Table 1.

Comparative Example 1

A conductive composition was prepared by mixing 2.00 g of the conductive polymer (A-1), 0.20 g of the water-soluble polymer (C-1), 93.80 g of ultrapure water, and 4 g of isopropyl alcohol.

A conductor was produced and various measurements were performed in the same manner as in Example 1, except that the obtained conductive composition was used, and the thickness of the conductive film was changed to 30 nm. The results are shown in Table 1.

Comparative Example 21

A conductive composition was prepared by mixing 2.00 g of the conductive polymer (A-1), 0.20 g of the water-soluble polymer (C-1), 92.80 g of ultrapure water, 4 g of isopropyl alcohol, and 1 g of toluene as a high boiling point solvent. Using the obtained conductive composition, the resist loss test was carried out. The results are shown in Table 1.

A conductor was produced and various measurements were performed in the same manner as in Example 1, except that the obtained conductive composition was used. The results are shown in Table 1.

TABLE 1

| | | | Ex. 1 | Ex. 2 | Ex. 3 | Ex. 4 | Ex. 5 | Comp. Ex. 1 | Comp. Ex. 2 |
|---|---|---|---|---|---|---|---|---|---|
| Conductive composition | Conductive polymer (A) | Purification | Done | Done | Done | Done | Done | Not done | Not done |
| | | Amount of polymerization residue [wt %] | 0.3 | 0.3 | 0.3 | 0.3 | 0.3 | 0.9 | 0.9 |
| | | Amount [wt %] | 0.29 | 0.29 | 0.29 | 0.29 | 0.29 | 2.00 | 2.00 |
| | Basic compound (B) | Type | — | DBN | TBAH | — | DBN | — | — |
| | | Amount [wt %] | 0 | 0.1 | 0.2 | 0 | 0.1 | 0 | 0 |
| | Water-soluble polymer (C) | Purification | Done | Done | Done | — | Done | Not done | Not done |
| | | Amount [wt %] | 0.03 | 0.26 | 0.13 | 0 | 0.26 | 0.20 | 0.20 |
| | High boiling point solvent (toluene) | Amount [wt %] | 0 | 0 | 0 | 0 | 0 | 0 | 1 |
| Conductive film | Film thickness [m] | | 10 | 10 | 10 | 10 | 30 | 30 | 10 |
| | Surface resistivity [Ω/sq.] | | $8 \times 10^6$ | $5 \times 10^9$ | $5 \times 10^{10}$ | $8 \times 10^6$ | $3 \times 10^9$ | $1 \times 10^6$ | $1 \times 10^6$ |
| | Amount of low molecular weight materials | IC [wt %] | 0.6 | 0.6 | 1.0 | 0.6 | 0.6 | 1.2 | 1.2 |
| | | LC-MS Area (Y) | $1.26 \times 10^6$ | $1.09 \times 10^7$ | $5.45 \times 10^6$ | — | $1.09 \times 10^7$ | $1.65 \times 10^8$ | $1.65 \times 10^8$ |
| | | Area (X) | $1.70 \times 10^6$ | $1.47 \times 10^7$ | $7.35 \times 10^6$ | — | $1.47 \times 10^7$ | $2.00 \times 10^8$ | $2.00 \times 10^8$ |
| | | Y/(X + Y) | 0.426 | 0.426 | 0.426 | — | 0.426 | 0.452 | 0.452 |
| | Current value | Average value [nA] | −2.5 | −0.11 | −0.29 | −0.93 | −0.15 | −12 | −12 |
| | | Standard deviation | 1.8 | 0.19 | 0.36 | 0.68 | 0.25 | 5.2 | 5.2 |
| | Arithmetic average roughness (Ra) [nm] | | 0.3 | 0.2 | 0.5 | 0.4 | 0.2 | 1.1 | 1.3 |
| Resist loss test | Resist loss [nm] | | 9 | 6 | Not done | Not done | Not done | Not done | 13 |
| | Evaluation | | A | A | | | | | B |

The amounts of the conductive polymer (A), the basic compound (B) and the water-soluble polymer (C) in Table 1 are in terms of pure contents. The "Amount of polymerization residue" means the amount (% by mass) of the polymerization residue derived from the conductive polymer (A) with respect to the total mass of the conductive polymer (A).

In Table 1, the amounts of ultrapure water and isopropyl alcohol contained in the conductive compositions are omitted.

As is clear from Table 1, the conductive films obtained in Examples 1 to 5 had a standard deviation of current value of 5 or less, and showed uniform conductivity. Particularly, in Examples 2, 3, and 5 in which the basic compound was used in combination, the standard deviation of the current value was even lower, and the conductivity was more uniform.

On the other hand, the conductive films obtained in Comparative Examples 1 and 2 had a standard deviation of the current value of 5.2, and showed non-uniform conductivity. Particularly, in Comparative Example 2 in which the conductive composition containing toluene, which is a high boiling point solvent, was used, the resist loss of the resist layer occurred easily.

In each of the Examples and the Comparative Examples, the amount of the low molecular weight materials derived from the conductive polymer (A) in the conductive film was higher than the amount of the polymerization residue in the conductive polymer (A). This is presumably because the heating during the formation of the conductive film caused the acidic group to be eliminated from the conductive polymer (A), resulting in increase in the amount of the low molecular weight materials derived from the conductive polymer (A) in the conductive film.

INDUSTRIAL APPLICABILITY

The conductive film of the present invention is useful as an antistatic film to be provided on a resist surface in a pattern forming method using a charged particle beam.

DESCRIPTION OF THE REFERENCE SIGNS

10 Conductor
11 Substrate
12 Conductive film
20 Laminate
21 Substrate
22 Resist layer
23 Antistatic film

The invention claimed is:

1. A conductive film comprising:
a conductive polymer (A); and
a water-soluble polymer (C) having a nitrogen-containing functional group;
wherein:
a thickness of the conductive film is 35 nm or less,
a surface resistivity of the conductive film is $1\times10^{11}$ Ω/sq. or less,
a standard deviation of current that flows through the conductive film upon application of voltage to the conductive film is 1.8 or less, and
a peak area ratio determined by formula (I) is 0.44 or less, which is determined based on results of analysis performed by the following measurement method using a high performance liquid chromatograph mass spectrometer:
(Measurement Method)
a test solution (β) obtained by extracting the water-soluble polymer (C) from an aqueous solution obtained by dissolving the conductive film in water with an organic solvent (β) is analyzed using a high performance liquid chromatograph mass spectrometer, and a peak area ratio is calculated by formula (I), wherein the organic solvent (β) is any one of n-butanol, butyl acetate, and methyl isobutyl ketone, Area ratio=$Y/(X+Y)$ (I), wherein X is a total peak area of an extracted ion chromatogram prepared with respect to ions derived from compounds having a molecular weight (M) of 600 or more from a total ion current chromatogram, Y is a total peak area of an extracted ion chromatogram prepared with respect to ions derived from compounds having a molecular weight (M) of less than 600 from the total ion current chromatogram.

2. The conductive film according to claim 1, further comprising a basic compound (β).

3. The conductive film according to claim 1, wherein the conductive polymer (A) has an acidic group.

4. The conductive film according to claim 2, wherein the conductive polymer (A) has an acidic group.

5. The conductive film according to claim 3, wherein the conductive polymer (A) has a monomer unit represented by formula (1):

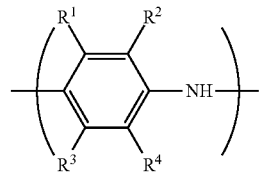

(1)

wherein each of $R^1$ to $R^4$ independently represents a hydrogen atom, a linear or branched alkyl group having 1 to 24 carbon atoms, a linear or branched alkoxy group having 1 to 24 carbon atoms, an acidic group, a hydroxy group, a nitro group or a halogen atom, with the proviso that at least one of $R^1$ to $R^4$ is an acidic group or a salt thereof, and the acidic group is a sulfonic acid group or a carboxy group.

6. The conductive film according to claim 4, wherein the conductive polymer (A) has a monomer unit represented by formula (1):

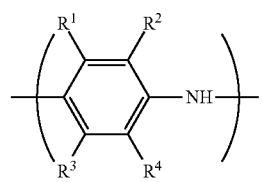

(1)

wherein each of $R^1$ to $R^4$ independently represents a hydrogen atom, a linear or branched alkyl group having 1 to 24 carbon atoms, a linear or branched alkoxy group having 1 to 24 carbon atoms, an acidic group, a hydroxy group, a nitro group or a halogen atom, with the proviso that at least one of $R^1$ to $R^4$ is an acidic group or a salt thereof, and the acidic group is a sulfonic acid group or a carboxy group.

7. The conductive film according to claim 1, which is suitable as an antistatic film in charged particle beam lithography.

8. A method for producing the conductive film of claim 1, comprising:
preparing a conductive composition containing the conductive polymer (A) and the water-soluble polymer (C); and
shaping the conductive composition into the conductive film.

9. The method according to claim 8, wherein an amount of a polymerization residue derived from the conductive polymer (A) in the conductive composition is 0.8% by mass or less, based on a total mass of the conductive polymer (A).

10. The method according to claim 8, wherein an amount of a high boiling point solvent having a boiling point of 180° C. or higher in the conductive composition is 150 ppm by mass or less, based on a total mass of the conductive composition.

11. The method according to claim 8, wherein the conductive composition further comprises 50% by mass or more of water, based on a total mass of the conductive composition.

12. A conductor comprising:
a substrate; and
the conductive film of claim 1 formed on at least a part of a surface of the substrate.

13. A method for forming a resist pattern, comprising:
laminating the conductive film of claim 1 on a surface of a resist layer comprising a chemically amplified resist, said resist layer formed on one surface of a substrate; and
irradiating the substrate with an electron beam according to a pattern on the surface to which the conductive film is laminated.

14. A laminate comprising:
a resist layer; and
an antistatic film formed on a surface of the resist layer; wherein
the antistatic film comprises:
a conductive polymer (A); and
a water-soluble polymer (C) having a nitrogen-containing functional group;
the antistatic film has a thickness of 35 nm or less,
the antistatic film has a surface resistivity of $1\times10^{11}$ Ω/sq. or less,
a standard deviation of current that flows through the antistatic film upon application of voltage to the antistatic film is 1.8 or less, and
a peak area ratio determined by formula (I) is 0.44 or less, which is determined based on results of analysis performed by the following measurement method using a high performance liquid chromatograph mass spectrometer:

(Measurement Method)
a test solution (β) obtained by extracting the water-soluble polymer (C) from an aqueous solution obtained by dissolving the conductive film in water with an organic solvent (β) is analyzed using a high performance liquid chromatograph mass spectrometer, and a peak area ratio is calculated by formula (I), wherein the organic solvent (β) is any one of n-butanol, butyl acetate, and methyl isobutyl ketone, $$\text{Area ratio} = Y/(X+Y) \tag{I},$$

wherein X is a total peak area of an extracted ion chromatogram prepared with respect to ions derived from compounds having a molecular weight (M) of 600 or more from a total ion current chromatogram, Y is a total peak area of an extracted ion chromatogram prepared with respect to ions derived from compounds having a molecular weight (M) of less than 600 from the total ion current chromatogram.

15. The conductive film according to claim 1, wherein the standard deviation of current that flows through the conductive film upon application of voltage to the conductive film is 1.5 or less.

* * * * *